United States Patent
Kim et al.

(10) Patent No.: US 7,811,681 B2
(45) Date of Patent: Oct. 12, 2010

(54) ELECTRON TRANSPORT COMPOUND AND ORGANIC LIGHT EMITTING DEVICE COMPRISING THE SAME

(75) Inventors: Jung Keun Kim, Seoul (KR); Jeongdae Seo, Incheon (KR); Hvun Cheol Jeong, Jinju-si (KR); Jong Kwan Bin, Yongin-si (KR); Chungun Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 888 days.

(21) Appl. No.: 11/653,243

(22) Filed: Jan. 16, 2007

(65) Prior Publication Data

US 2007/0167626 A1    Jul. 19, 2007

(30) Foreign Application Priority Data

Jan. 16, 2006   (KR)   .................. 10-2006-0004687
Jan. 16, 2006   (KR)   .................. 10-2006-0004688
Jan. 16, 2006   (KR)   .................. 10-2006-0004689

(51) Int. Cl.
*H01L 51/54*    (2006.01)
*C07C 13/567*   (2006.01)
*C07C 15/38*    (2006.01)
*C07C 15/40*    (2006.01)
*C07D 213/02*   (2006.01)
*C07D 215/00*   (2006.01)
*C07D 217/00*   (2006.01)
*C07D 241/38*   (2006.01)
*C07D 471/12*   (2006.01)
*H01B 1/12*     (2006.01)

(52) U.S. Cl. .................. 428/690; 428/917; 313/504; 313/506; 546/1; 546/88; 546/139; 546/152; 546/122; 585/26; 585/27

(58) Field of Classification Search .................. None
See application file for complete search history.

(56) References Cited

U.S. PATENT DOCUMENTS

2003/0157365 A1*   8/2003   Kinoshita et al. ........... 428/690
2008/0012475 A1*   1/2008   Oyamada et al. ........... 313/504

FOREIGN PATENT DOCUMENTS

WO    WO 2006/057325 A1    1/2006

OTHER PUBLICATIONS

Park et al., Mol. Cryst. Lid. Cryst., vol. 444, pp. 177-184, 2006.*

* cited by examiner

*Primary Examiner*—Dawn Garrett
(74) *Attorney, Agent, or Firm*—Morgan Lewis & Bockius LLP

(57) ABSTRACT

An organic light emitting device having a pyrene based electron transport compound and an electron injecting and transport layer comprising the electron transport compound is provided.

8 Claims, No Drawings

ELECTRON TRANSPORT COMPOUND AND ORGANIC LIGHT EMITTING DEVICE COMPRISING THE SAME

This nonprovisional application claims priority under 35 U.S.C. §119(a) on Patent Application Nos. 10-2006-0004687, 10-2006-0004688, and 10-2006-0004689, filed in Republic of Korea on Jan. 16, 2006, the entire contents of which are hereby incorporated by reference.

BACKGROUND

1. Field

This document relates to an electron transport compound and an organic light emitting device comprising the same.

2. Related Art

In general, an organic light emitting display is a self-emitting display for emitting light by electrically exciting a fluorescent compound and has been spotlighted as a future generation display that can solve problems of a liquid crystal display as it can be driven in a low voltage, easily reduce a thickness, have a wide viewing angle and a fast response speed, etc.

The organic light emitting device comprises an organic emitting layer between an anode and a cathode. The organic light emitting device forms an exciton, which is a hole-electron pair, by coupling a hole received from the anode and an electron received from the cathode within the organic light emitting layer and emits light by generating energy when the exciton returns to a ground level. The organic light emitting device further comprises a hole (electron) injecting layer and/or a hole (electron) transporting layer between the anode or the cathode and the emitting layer.

A process of manufacturing organic light emitting device is as follows.

(1) First, an anode is formed on a transparent substrate. As the material for anode, Indium Tin Oxide (ITO) is generally used.

(2) A hole injecting layer (HIL) is formed on the anode. As the HIL, copper phthalocyanine (CuPc) is generally used and the thickness of the HIL is 10 nm to 30 nm.

(3) Next, a hole transport layer (HTL) is formed on the HIL. As the hole transport layer, 4,4'-bis[N-(1-naphthyl)-N-phenthylamino]-biphenyl (NPB) is generally used and the thickness of the HTL is 30 nm to 60 nm.

(4) An organic emitting layer is formed on the HTL. The organic emitting layer may comprise a host and a dopant. In a case of green light emitting layer, tris(8-hydroxy-quinolatealuminum ($Alq_3$) as the host is deposited in a thickness of about 30 to 60 nm and as a dopant, N-Methylquinacridone (MQD) is doped in the host.

(5) An electron transport layer (ETL) and an electron injecting layer (EIL) are consecutively formed or one electron injecting and transport layer is formed on the organic emitting layer. In a case of green light emitting layer, because $Alq_3$ of (4) has good electron transport ability, an electron injecting/transport layer may not be separately used.

(6) Next, a cathode is formed and finally a protective layer is stacked.

However, conventional organic light emitting device, particularly, an electron transport compound for an electron injecting layer or an electron transport layer has problems of low electron transport efficiency in using for a display device and difficulty of deposition. Further, a conventional electron transport compound has a problem of a short lifetime due to high possibility of crystallization and deterioration.

SUMMARY

An object of this document is to provide an organic light emitting device having a pyrene based electron transport compound and an electron injecting and transport layer comprising the electron transport compound.

Another object of this document is to provide an electron transport compound that has high electron transport efficiency, and good deposition characteristics, prevents crystallization, and has no influence on a lifetime of organic light emitting device.

Another object of this document is to provide an organic light emitting device having high brightness, high efficiency, and a long lifetime using an electron transport compound.

DESCRIPTION

Hereinafter, embodiments are described in detail.

Embodiment 1

In order to achieve the object, this document provides a pyrene based electron transport compound having chemical formula 1.

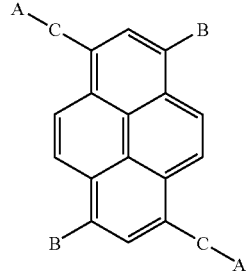

[Chemical formula 1-1]

Pyrene based compound of chemical formula 1-1 is a very important compound among hydrocarbons. In the pyrene based compound, carbons are numbered clockwise starting with a carbon having a substituent A-C. Accordingly, an electron transport compound according to an embodiment of this document comprises a pyrene based compound in which A-C is bonded to carbon 1 and 6, and B is bonded to carbon 3 and 8. The substituents A, B, and C may be substituted or not substituted.

The electron transport compound is a compound that injects an electron from a cathode to other layer or transports an injected electron to other layers. For example, in organic light emitting device, an electron transport compound is a compound that may be a material of an electron injecting layer, an electron transport layer, or an electron injecting and transport layer in which the electron injecting layer and the electron transport layer are mixed.

In this document, the electron injecting and transport layer is used to generally designate layers, which are related to injecting and transporting of an electron, such as an electron injecting layer, an electron transport layer, or an electron injecting and transport layer in which the electron injecting layer and the electron transport layer are mixed.

A that is substituted or is not substituted may be selected from a group consisting of pyridinyl, quinolinyl, isoquinolinyl, quinoxalinyl, bipyridinyl, terpyridinyl, and phenanthrolinyl.

Further, B and C that are substituted or are not substituted may be selected from a group consisting of phenyl, biphenyl, naphthyl, fluorenyl, terphenyl, phenanthrolinyl, phenanthryl, and anthryl.

When the A, B, and C are substituted, a substituent of the A, B, and C may be selected from a group consisting of aryl, alkyl, aryloxy, alkoxy, allylamino, alkylamino, halogen, and cyano.

Further, when the A, B, and C are substituted, a substituent of the A, B, and C may be selected from a group consisting of phenyl, biphenyl, triphenylmethyl, phenylethylidene, diphenylethylidene, phenylmethylidyne, phenoxy, tolyoxy, methyl, ethyl, propyl, i-propyl, t-butyl, cyclohexyl, diphenylamino, morpholine, methoxy, ethoxy, propoxy, butoxy, dimethylamino, diphenylamino, fluorine, and chlorine.

The A that is substituted or is not substituted is given by chemical formulas 1-2 and 1-3.

[Chemical Formula 1-2]

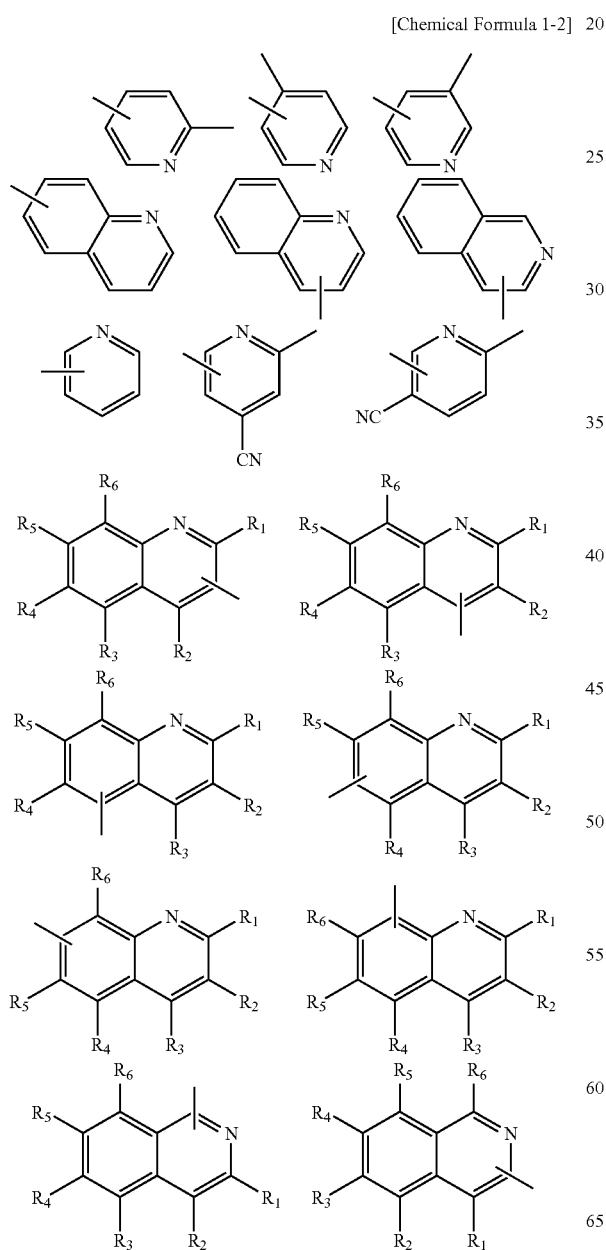

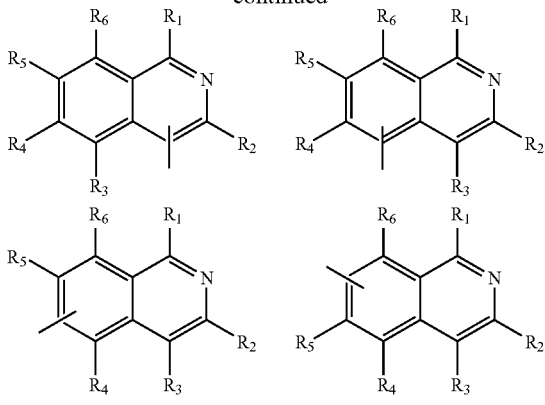

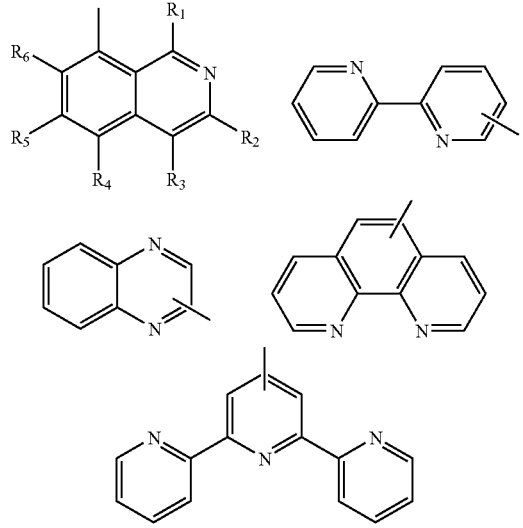

where any one of R1, R2, R3, R4, R5, and R6 is CH3, and the remaining ones are H.

[Chemical formula 1-3]

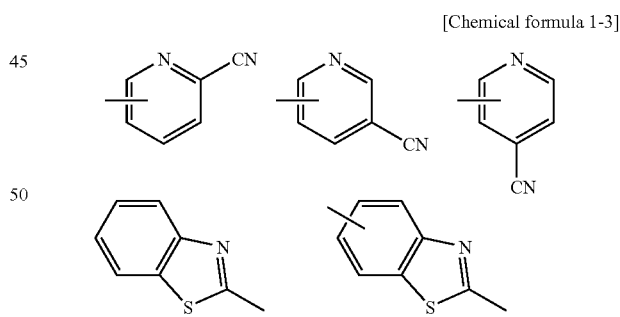

Similarly, the B and C that are substituted or not substituted are given by chemical formula 1-4.

[Chemical formula 1-4]

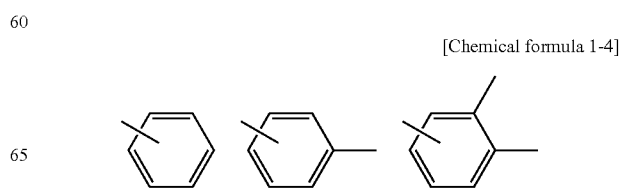

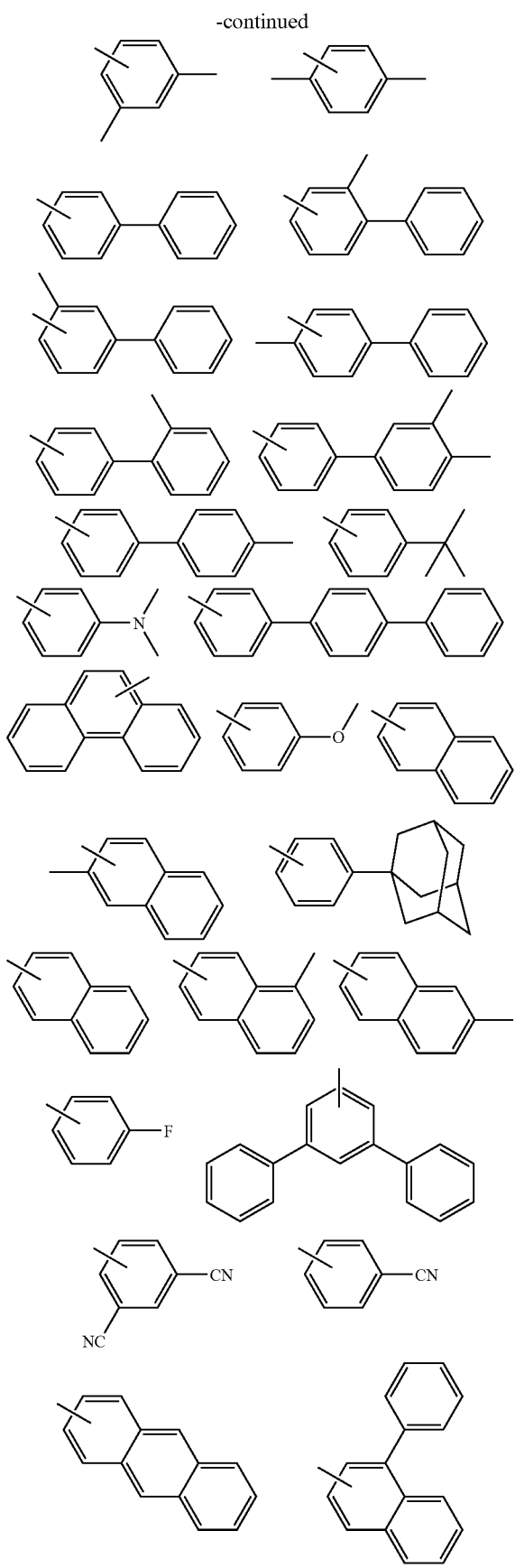

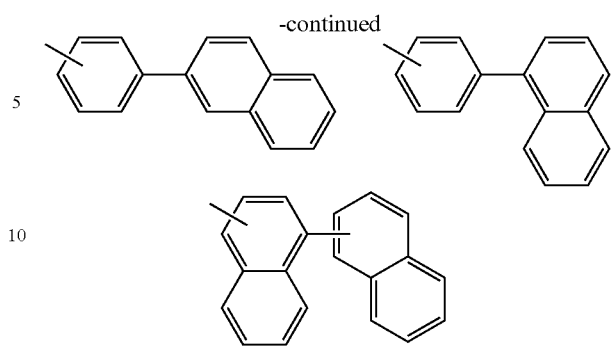

Various forms of electron transport compounds can be formed by combining the pyrene based electron transport compound of chemical formula 1-1 with substituents of chemical formulas 1-2 to 1-4. The electron transport compounds can be easily selected by those skilled in the art according to necessity of brightness, color purity, or a driving voltage.

This document provides organic light emitting device having the electron injecting and transport layer comprising the electron transport compound described above. The electron injecting and transport layer may be one or both of an electron injecting layer or an electron transport layer. The electron injecting and transport layer may be formed between an organic light emitting layer and a cathode. The electron injecting and transport layer may have a different layer position when participating in injecting and transporting of an electron as described above.

Below, synthesis examples of some compounds of the pyrene based electron transport compounds of chemical formula 1-1 are described. Only synthesis examples of some compounds are described, but synthesis examples of other pyrene based electron transport compounds of chemical formula 1-1 are similar to these synthesis examples, the synthesis examples can be easily executed by those skilled in the art, and thus descriptions thereof will be omitted.

SYNTHESIS EXAMPLE 1,5-di(4-(3'-pyridine)phenyl)-3,6-diphenylpyrene among electron transport compounds of an electron injecting and transport layer of organic light emitting device according to a first embodiment of this document is synthesized as follows.

(1) Synthesis of 1,5-di(4-(3'-pyridine)-phenyl)pyrene

[Reaction equation 1-1]

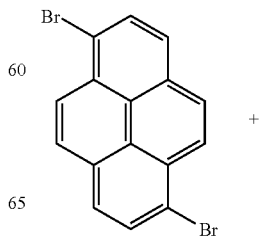

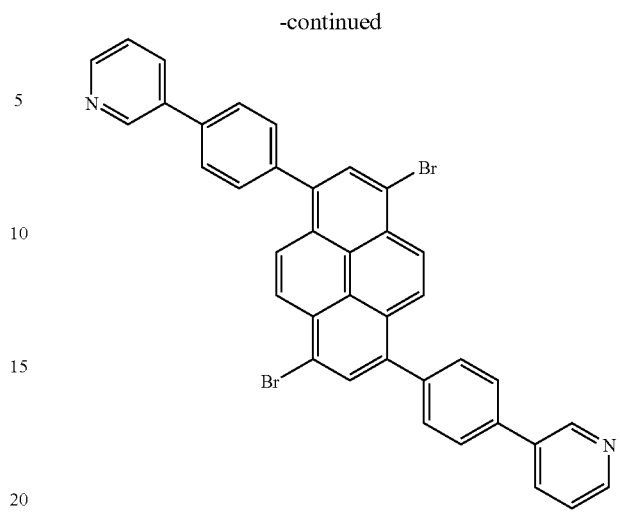

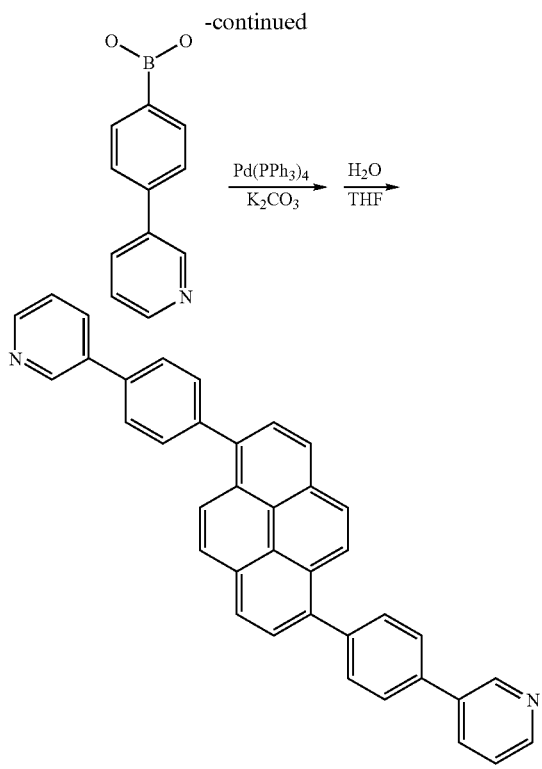

8.3 g (0.0416 mol) of 4-(3'-pyridine)phenyl boronic acid and 5 g (0.0139 mol) of 1,5-dibromopyrene were put in 100 mL of anhydrous THF and they were stirred in a dried three neck round bottom flask.

1.0 g of tetrakis(triphenylphosphine)palladium(0) and 15 g of potassium carbonate were melted in 100 mL of H₂O and added to the flask. Then they were stirred for 24 hours in a bath of 100° and when a reaction was ended, THF was removed from a reaction mixture.

Thereafter, the reaction mixture was extracted using dichloromethane and water and distilled under a reduced pressure, then the distilled mixture was purified by passing through a silica gel column. The purified mixture was distilled under a reduced pressure again. The purified and distilled mixture was recrystallized using dichloromethane and methanol and filtered. Then 1,5-di(4-(3'-pyridine)-phenyl) pyrene was obtained.

(2) Synthesis of 3,6-dibromo-1,5-di(4-(3'-pyridine)-phenyl)pyrene

[Reaction Equation 1-2]

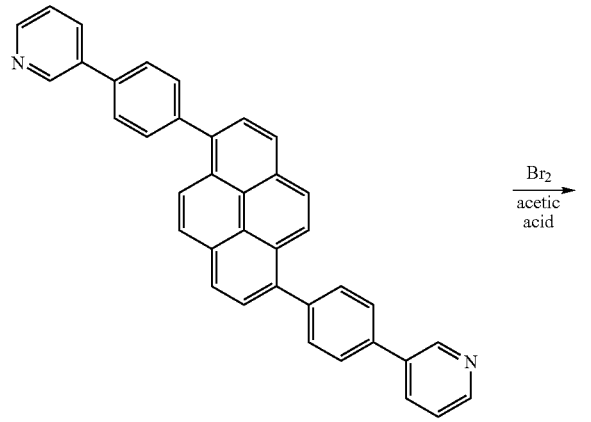

1,5-di(4-(3'-pyridine)-phenyl)pyrene was put in 80 mL of acetic acid and they were stirred in a dried three neck round bottom flask. After 1.9 g (0.0118 mol) of bromine (Br₂) was added to the reaction mixture at a room temperature and when a reaction was ended, filtering was performed. By washing and then drying the reaction mixture with excessive distilled water, 3,6-dibromo-1,5-di(4-(3'-pyridine)-phenyl)pyrene was obtained.

(3) Synthesis of 1,5-di(4-(3'-pyridine)phenyl)-3,6-diphenylpyrene

[Reaction Equation 1-3]

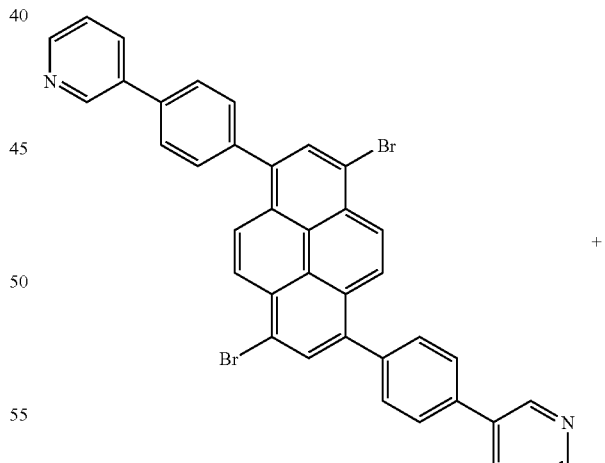

+

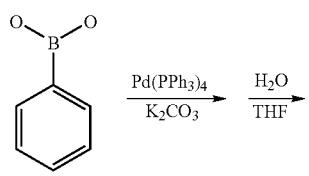

-continued

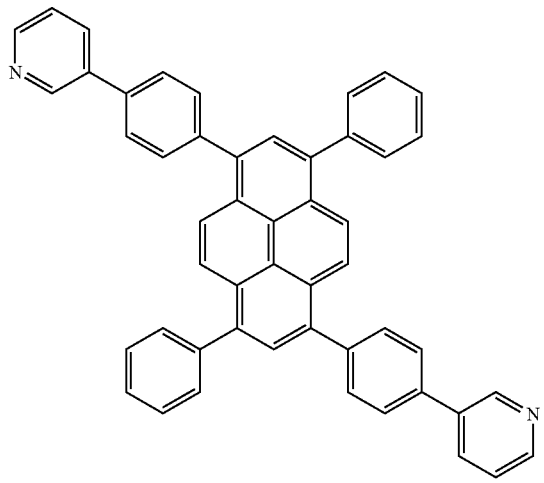

3 g (0.0045 mol) of 3,6-dibromo-1,5-di(4-(3'-pyridine)-phenyl)pyrene and 1.65 g (0.0135 mol) of phenyl boronic acid were put in 80 mL of anhydrous THF and they are stirred in a dried three neck round bottom flask.

0.4 g of tetrakis(triphenylphosphine)palladium(0) and 10 g of potassium carbonate were melted in 80 mL of $H_2O$ and added to the three neck round bottom flask. Then the reaction mixture was stirred for 24 hours in a bath of 100□ and when a reaction was ended, THF was removed from the reaction mixture.

Thereafter, the reaction mixture was extracted using dichloromethane and water and distilled under a reduced pressure. The distilled mixture was purified by passing through a silica gel column, then distilled under a reduced pressure again. The purified and distilled mixture was recrystallized using dichloromethane and methanol and filtered. Then, 1,5-di(4-(3'-pyridine)phenyl)-3,6-diphenylpyrene, which is a final product was obtained.

[Brightness, Color Purity and Driving Voltage Test 1]

In order to confirm brightness characteristic and color purity of organic light emitting device according to an embodiment of this document, conventional organic light emitting device and organic light emitting device according to an embodiment of this document were manufactured and brightness, color purity, and a driving voltage thereof were measured under the same condition.

In other words, organic light emitting device according to an embodiment of this document was manufactured using the electron transport compound synthesized in the synthesis example and conventional organic light emitting device was manufactured using a conventional material in the electron injecting and transport layer. Then brightness, color purity, and a driving voltage thereof were measured under the same condition.

In examples, although some electron transport compounds according to embodiments of this document are described, an organic light emitting device manufactured using other pyrene based electron transport compound of chemical formula 1-1 may show the same or similar result as examples.

The result may be expected by those skilled in the art and thus descriptions of other compounds will be omitted.

(1) A COMPARATIVE EXAMPLE

Conventional Organic Light Emitting Device

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/$Alq_3$(200 Å)+GD−1(1%) (50 Å)/$Alq_3$(350 Å)/LiF(5 Å)/Al(1000 Å)) were formed on ITO in $1.0×10^{-6}$ torr.

When current of 0.9 mA was applied to the device, brightness was 1251 cd/$m^2$, a driving voltage was 6.5V, and a value of a color coordinate CIE was x=0.307 and y=0.612.

[Chemical formula 1-5]

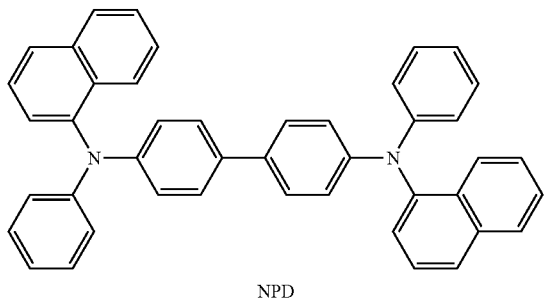

NPD

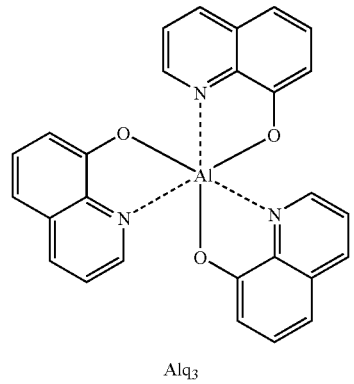

$Alq_3$

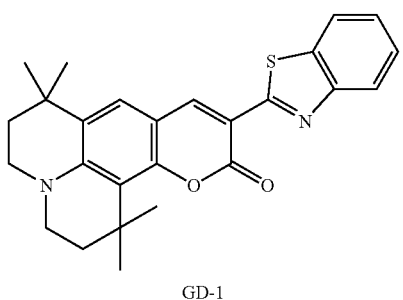

GD-1

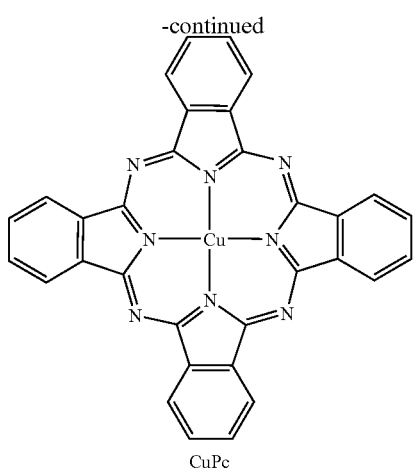

CuPc

(2) EXAMPLE 1

ITO glass was washed after being patterned so that a light emitting area thereof became 3 mm×3 mm. After the substrate was mounted in a vacuum chamber, a hole injecting layer/a hole transport layer/a green organic emitting layer (host+ dopant)/an electron injecting and transport layer/cathode (CuPc(650 Å)/NPD(400 Å)/Alq$_3$(200 Å)+GD-1 (1%) (50 Å)/PA-1(350 Å)/LiF (5 Å)/Al (1000 Å)) were formed on ITO in $1.0 \times 10^{-6}$ torr. PA-1 is a pyrene based electron transport compound of chemical formula 1-6.

When current of 0.9 mA was applied to the device, brightness was 2452 cd/m$^2$, a driving voltage was 4.7V, and a value of a color coordinate CIE was x=0.301 and y=0.606.

[Chemical formula 1-6]

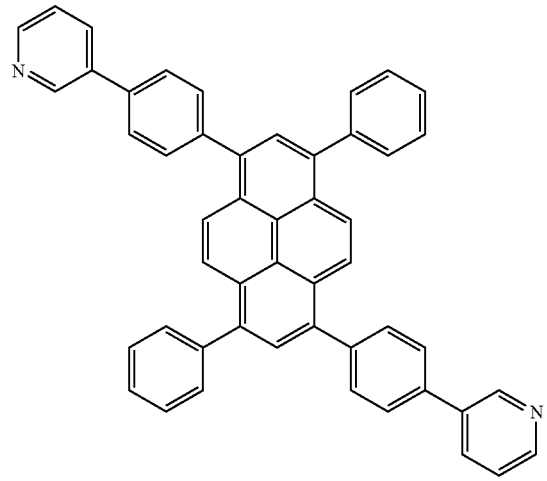

(3) EXAMPLE 2

ITO glass was washed after being patterned so that a light emitting area thereof became 3 mm×3 mm. After the substrate was mounted in a vacuum chamber, a hole injecting layer/a hole transport layer/a green organic emitting layer (host+ dopant)/an electron injecting and transport layer/cathode CuPc(650 Å)/NPD(400 Å)/Alq$_3$(200 Å)+GD-1(1%) (50 Å)/PA-2(350 Å)/LiF(5 Å)/Al(1000 Å) were formed on ITO in $1.0 \times 10^{-6}$ torr. PA-2 is a pyrene based electron transport compound of chemical formula 1-7.

When current of 0.9 mA was applied to the device, brightness was 2328 cd/m$^2$, a driving voltage was 5.0V, and a value of a color coordinate CIE was x=0.302 and y=0.612.

[Chemical formula 1-7]

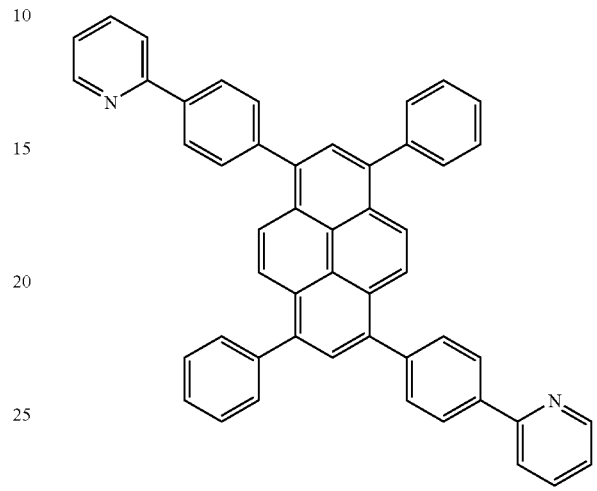

(4) EXAMPLE 3

ITO glass was washed after being patterned so that a light emitting area thereof became 3 mm×3 mm. After the substrate was mounted in a vacuum chamber, a hole injecting layer/a hole transport layer/a green organic emitting layer (host+ dopant)/an electron injecting and transport layer/cathode (CuPc(650 Å)/NPD(400 Å)/Alq$_3$(200 Å)+GD-1(1%)(50 Å)/PB-1(350 Å)/LiF(5 Å)/Al(1000 Å)) were formed on ITO in $1.0 \times 10^{-6}$ torr. PB-1 is a pyrene based electron transport compound of chemical formula 1-8.

[Chemical formula 1-8]

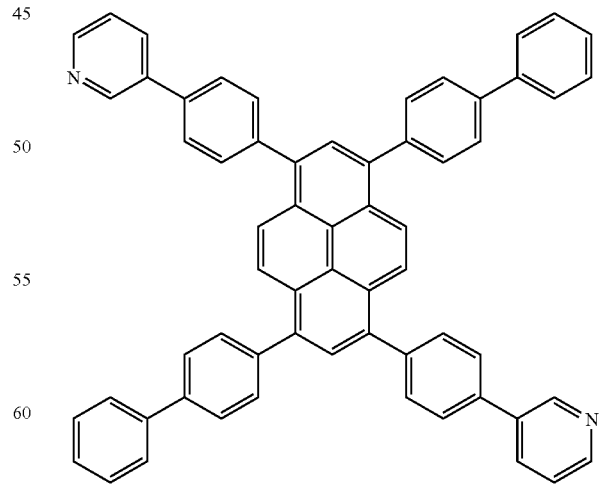

When current of 0.9 mA was applied to the device, brightness was 2751 cd/m$^2$, a driving voltage was 5.1V, and a value of a color coordinate CIE was x=0.298 and y=0.610.

(5) EXAMPLE 4

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1 (1%)(50 Å)/PC-1(350 Å)/LiF(5 Å)/Al(1000 Å)) were formed on ITO in 1.0×10$^{-6}$ torr. PC-1 is a pyrene based electron transport compound of chemical formula 1-9.

[Chemical formula 1-9]

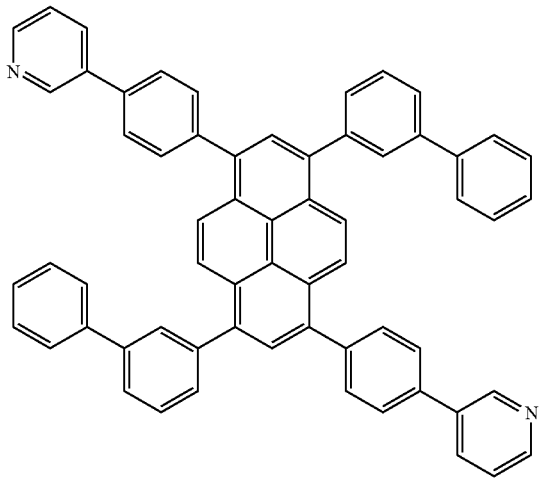

When current of 0.9 mA was applied to the device, brightness was 2617 cd/m$^2$, a driving voltage was 5.3V, and a value of a color coordinate CIE was x=0.307 and y=0.612.

(6) EXAMPLE 5

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1 (1%) (50 Å)/PE-1(350 Å)/LiF(5 Å)/Al(1000 Å)) were formed on ITO in 1.0×10$^{-6}$ torr. PE-1 is a pyrene based electron transport compound of chemical formula 1-10.

[Chemical formula 1-10]

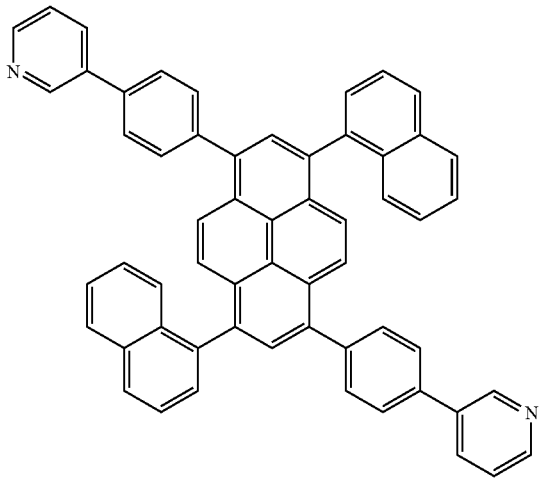

When current of 0.9 mA was applied to the device, brightness was 2472 cd/m$^2$, a driving voltage was 5.4V, and a value of a color coordinate CIE was x=0.31 and y=0.614.

(7) EXAMPLE 6

Organic Light Emitting Device According to a Sixth Embodiment of this Document

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1 (1%) (50 Å)/PF-1(350 Å)/LiF(5 Å)/Al(1000 Å)) were formed on ITO in 1.0×10$^{-6}$ torr. PF-1 is a pyrene based electron transport compound of chemical formula 1-11.

[Chemical formula 1-11]

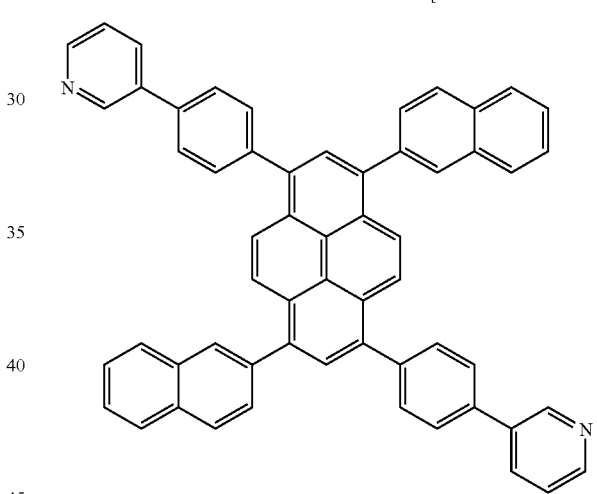

When current of 0.9 mA was applied to the device, brightness was 2217 cd/m$^2$, a driving voltage was 5.5V, and a value of a color coordinate CIE was x=0.302 and y=0.610.

(8) EXAMPLE 7

Organic Light Emitting Device According to a Seventh Embodiment of this Document ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1 (1%) (50 Å)/PK-1(350 Å)/LiF(5 Å)/Al(1000 Å)) were formed on ITO in 1.0×10$^{-6}$ torr. PK-1 is a pyrene based electron transport compound of chemical formula 1-12.

[Chemical formula 1-12]

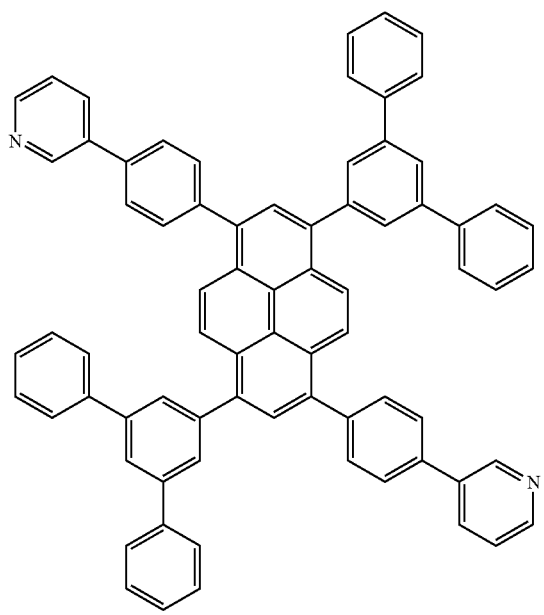

When current of 0.9 mA was applied to the device, brightness was 2830 cd/m², a driving voltage was 5.0V, and a value of a color coordinate CIE was x=0.297 and y=0.609.

As can be seen in the comparative example and examples, when organic light emitting device according to embodiments of this document comprise pyrene based electron transport compound of chemical formula 1-1 described above in an electron injecting and transport layer, a value of a color coordinate CIE was x=0.397 to 0.307 and y=0.606 to 0.612, and thus it can be seen that an electron injecting and transport layer performs its own function very effectively.

Referring to Table 1, brightness of organic light emitting device according to embodiments of this document improves by minimum 77.2% (the sixth embodiment) and maximum 26% (the seventh embodiment), compared to brightness of conventional organic light emitting device. It can be seen that a driving voltage of organic light emitting device according to embodiments of this document was decreased to 4.7V to 5.5V, compared to a driving voltage of conventional organic light emitting device.

TABLE 1

|  | brightness | driving voltage |
|---|---|---|
| Comparative example | 1251 cd/m² | 6.5 V |
| Example 1 | 2452 cd/m² | 4.7 V |
| Example 2 | 2328 cd/m² | 5.0 V |
| Example 3 | 2751 cd/m² | 5.1 V |
| Example 4 | 2617 cd/m² | 5.3 V |
| Example 5 | 2472 cd/m² | 5.4 V |
| Example 6 | 2217 cd/m² | 5.5 V |
| Example 7 | 2830 cd/m² | 5.0 V |

Embodiment 2

In order to achieve the object, this document provides a pyrene based electron transport compound having chemical formula 2-1.

[Chemical formula 2-1]

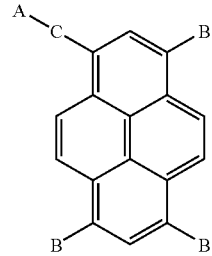

Pyrene based compound of chemical formula 2-1 is a very important compound among hydrocarbons. In the pyrene based compound, carbons are numbered clockwise starting with a carbon having a substituent A-C. Accordingly, an electron transport compound according to an embodiment of this document comprises a pyrene based compound in which A-C is bonded to carbon 1 and B is bonded to carbon 3, 6 and 8. The substituents A, B, and C may be substituted or not substituted.

The electron transport compound is a compound that injects an electron from a cathode to other layer or transports an injected electron to other layers. For example, in organic light emitting device, an electron transport compound is a compound that may be a material of an electron injecting layer, an electron transport layer, or an electron injecting and transport layer in which the electron injecting layer and the electron transport layer are mixed.

In this document, the electron injecting and transport layer is used to generally designate layers, which are related to injecting and transporting of an electron, such as an electron injecting layer, an electron transport layer, or an electron injecting and transport layer in which the electron injecting layer and the electron transport layer are mixed.

A that is substituted or is not substituted may be selected from a group consisting of pyridinyl, quinolinyl, isoquinolinyl, quinoxalinyl, bipyridinyl, terpyridinyl, and phenanthrolinyl.

Further, B and C that are substituted or are not substituted may be selected from a group consisting of phenyl, biphenyl, naphthyl, fluorenyl, terphenyl, phenanthrolinyl, phenanthryl, and anthryl.

When the A, B, and C are substituted, a substituent of the A, B, and C may be selected from a group consisting of aryl, alkyl, aryloxy, alkoxy, allylamino, alkylamino, halogen, and cyano.

Further, when the A, B, and C are substituted, a substituent of the A, B, and C may be selected from a group consisting of phenyl, biphenyl, triphenylmethyl, phenylethylidene, diphenylethylidene, phenylmethylidyne, phenoxy, tolyoxy, methyl, ethyl, propyl, i-propyl, t-butyl, cyclohexyl, diphenylamino, morpholine, methoxy, ethoxy, propoxy, butoxy, dimethylamino, diphenylamino, fluorine, and chlorine.

The A that is substituted or is not substituted is given by chemical formulas 2-2 and 2-3.

[Chemical Formula 2-2]
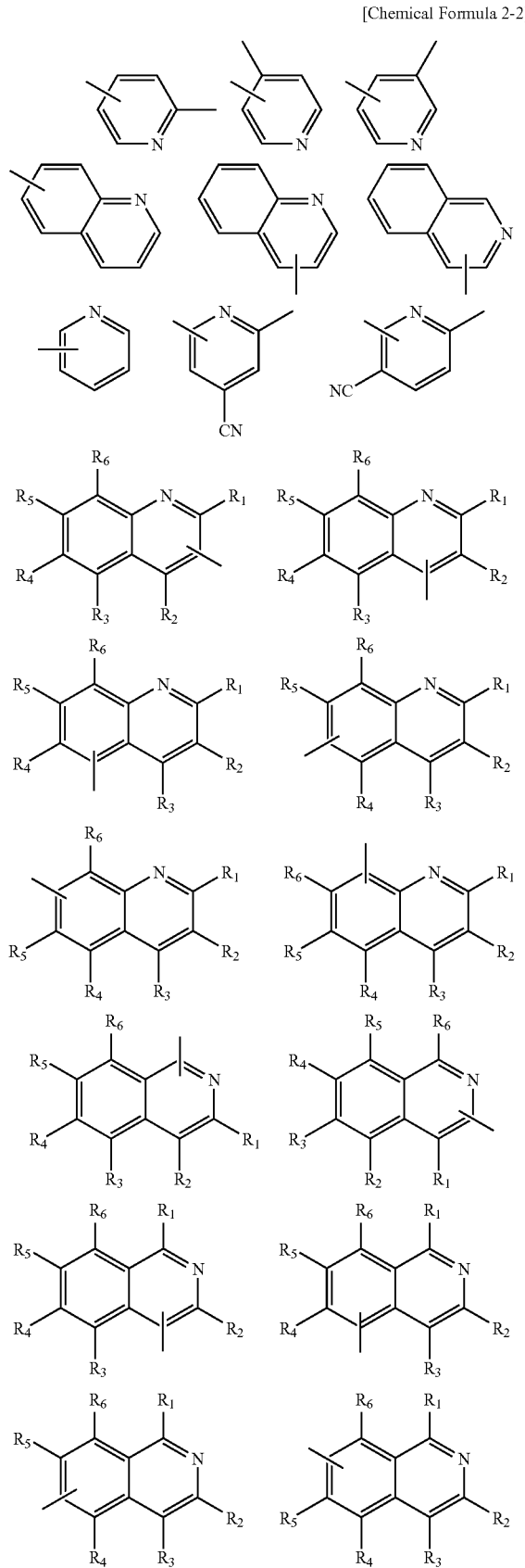
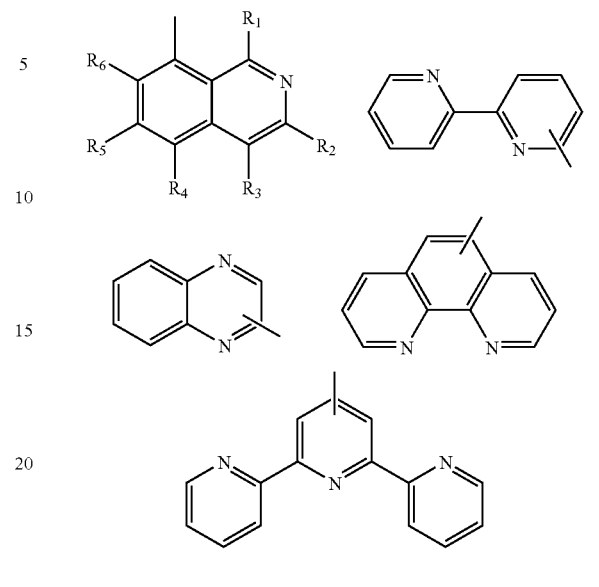
where any one of R1, R2, R3, R4, R5, and R6 is CH3, and the remaining ones are H.
[Chemical formula 2-3]
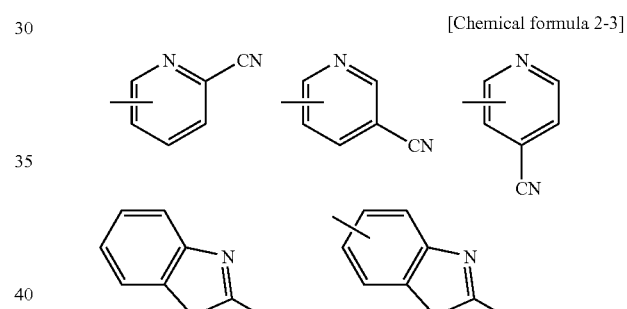
Similarly, the B and C that are substituted or not substituted are given by chemical formula 2-4.
[Chemical Formula 2-4]
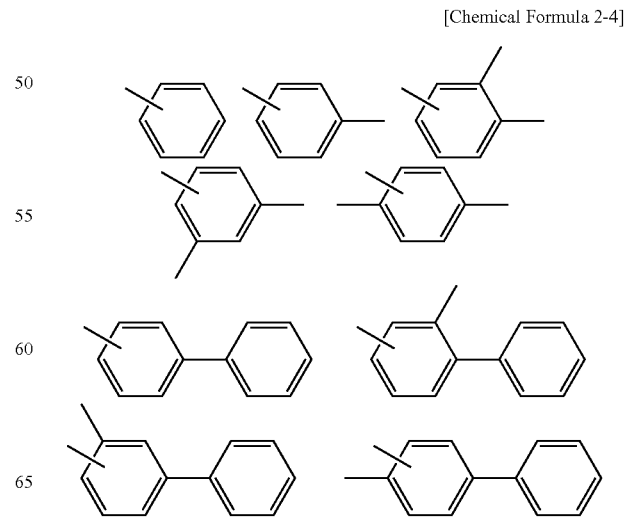

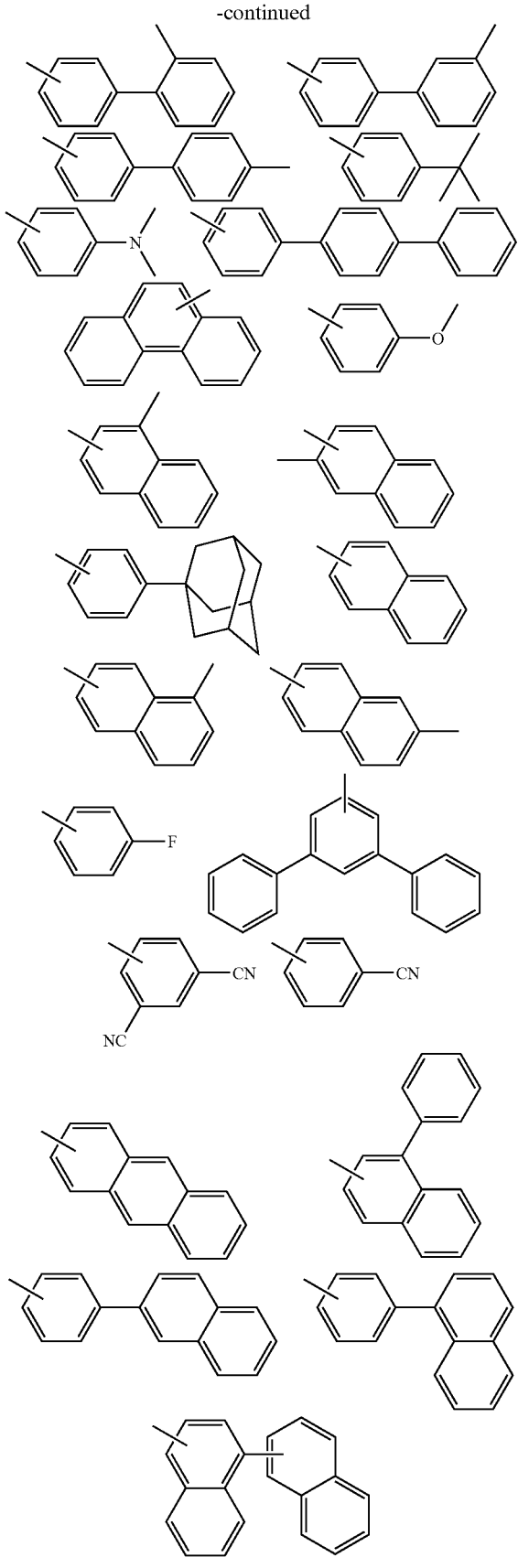

Various forms of electron transport compounds can be formed by combining the pyrene based electron transport compound of chemical formula 2-1 with substituents of chemical formulas 2-2 to 2-4. The electron transport compounds can be easily selected from organic light emitting device such as organic light emitting device by those skilled in the art according to necessity of brightness, color purity, or a driving voltage.

This document provides organic light emitting device having the electron injecting and transport layer comprising the electron transport compound described above. The electron injecting and transport layer may be one or both of an electron injecting layer or an electron transport layer. The electron injecting and transport layer may be formed between an organic or inorganic light emitting layer and a cathode. The electron injecting and transport layer may have a different layer position when participating in injecting and transporting of an electron as described above.

Below, synthesis examples of some compounds of the pyrene based electron transport compounds of chemical formula 2-1 are described. Only synthesis examples of some compounds are described, but synthesis examples of other pyrene based electron transport compounds of chemical formula 2-1 are similar to these synthesis examples, the synthesis examples can be executed by those skilled in the art, and thus descriptions thereof will be omitted.

SYNTHESIS EXAMPLE 1-(4-(3'-pyridine)phenyl)-3,6,8-triphenylpyrene among electron transport compounds of an electron injecting and transport layer of organic light emitting device according to an embodiment of this document is synthesized as follows.

(1) Synthesis of 1-(4-(3'-pyridine)phenyl)pyrene

[Reaction equation 2-1]

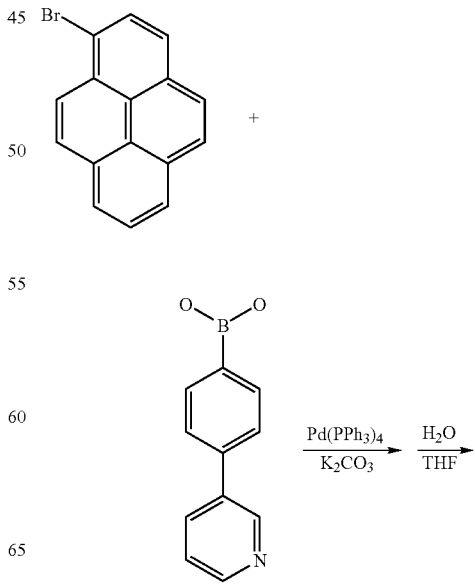

-continued

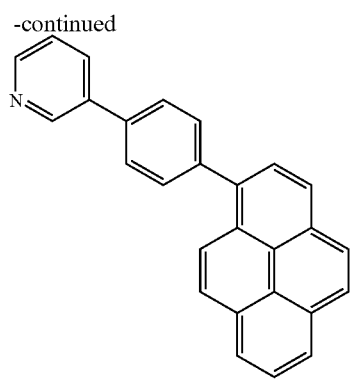

5.31 g (0.0267 mol) of 4-(3'-pyridine) phenyl boronic acid and 5 g (0.0178 mol) of 1-bromopyrene were put in 100 mL of anhydrous THF and they were stirred in a dried three neck round bottom flask.

1.0 g of tetrakis(triphenylphosphine)palladium(0) and 15 g of potassium carbonate were melted in 100 mL of $H_2O$ and added to the flask. Then they were stirred for 24 hours in a bath of 100☐. When a reaction was ended, THF was removed from a reaction mixture.

Thereafter, the reaction mixture was extracted using dichloromethane and water and distilled under a reduced pressure then the distilled mixture was purified by passing through a silica gel column. The purified mixture was distilled under a reduced pressure again. The purified and distilled mixture was recrystallized using dichloromethane and methanol and filtered. Then 1-(4-(3'-pyridine)-phenyl)pyrene was obtained.

(2) Synthesis of 1-(4-(3'-pyridine)-phenyl)-3,6,8-tribromopyrene

[Reaction Equation 2-2]

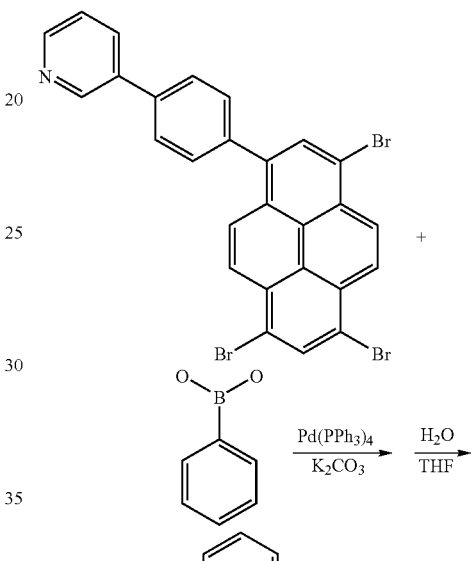

3 g (0.0084 mol) of 1-(4-(3'-pyridine)-phenyl)pyrene was put in 80 mL of acetic acid and they were stirred in a dried three neck round bottom flask. After 4.0 g (0.0252 mol) of bromine ($Br_2$) was added to the reaction mixture at a room temperature and when a reaction was ended, filtering was performed. By washing and then drying the reaction mixture with excessive distilled water, 1-(4-(3'-pyridine)-phenyl)-3,6,8-tribrmopyrene was obtained.

(3) Synthesis of 1-(4-(3'-pyridine)phenyl)-3,6,8-triphenylpyrene

[Reaction Equation 2-3]

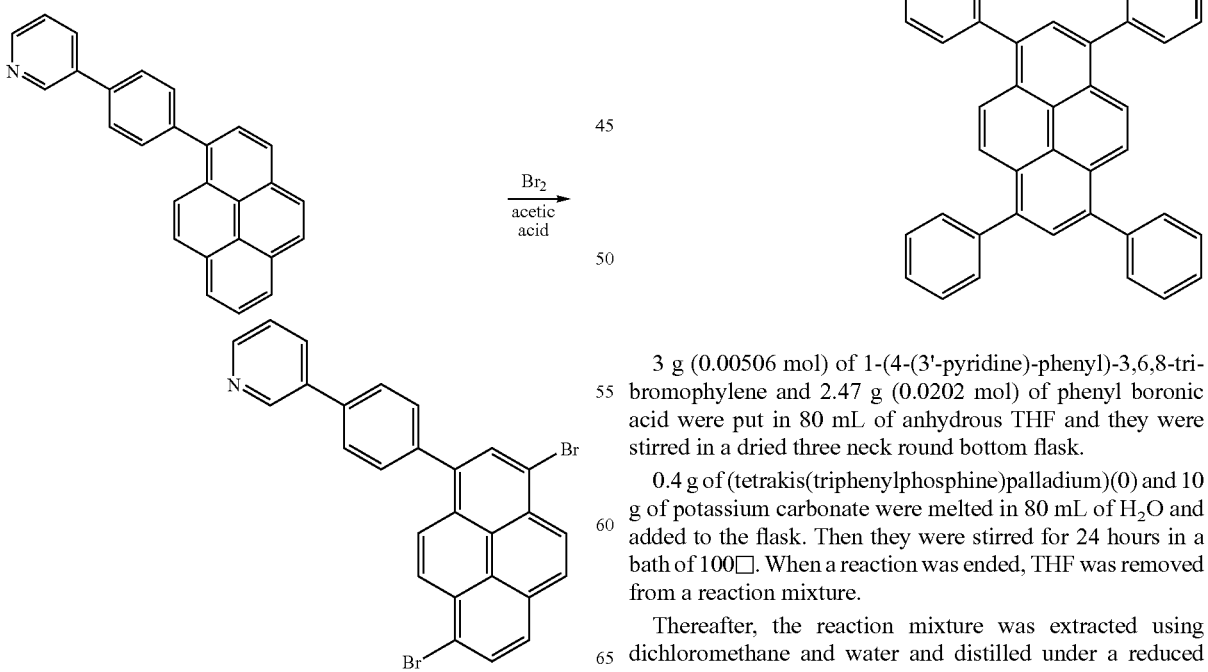

3 g (0.00506 mol) of 1-(4-(3'-pyridine)-phenyl)-3,6,8-tribromophylene and 2.47 g (0.0202 mol) of phenyl boronic acid were put in 80 mL of anhydrous THF and they were stirred in a dried three neck round bottom flask.

0.4 g of (tetrakis(triphenylphosphine)palladium)(0) and 10 g of potassium carbonate were melted in 80 mL of $H_2O$ and added to the flask. Then they were stirred for 24 hours in a bath of 100☐. When a reaction was ended, THF was removed from a reaction mixture.

Thereafter, the reaction mixture was extracted using dichloromethane and water and distilled under a reduced pressure then the distilled mixture was purified by passing through a silica gel column. The purified mixture was distilled under a reduced pressure again. The purified and distilled mixture was recrystallized using dichloromethane and methanol and filtered. Then 1-(4-(3'-pyridine)-phenyl)-3,6,8-triphenylenepyrene was obtained.

[Brightness, Color Purity and Driving Voltage Test 2]

In order to confirm brightness characteristic and color purity of organic light emitting device according to an embodiment of this document, conventional organic light emitting device and organic light emitting device according to an embodiment of this document were manufactured and brightness, color purity, and a driving voltage thereof were measured under the same condition.

In other words, organic light emitting device according to an embodiment of this document was manufactured using the electron transport compound synthesized in the synthesis example and conventional organic light emitting device was manufactured using a conventional material in the electron injecting and transport layer. Then brightness, color purity, and a driving voltage thereof were measured under the same condition.

In examples, although some electron transport compounds according to embodiments of this document are described, an organic light emitting device manufactured using other pyrene based electron transport compound of chemical formula 1-1 may show the same or similar result as examples. The result may be expected by those skilled in the art and thus descriptions of other compounds will be omitted.

(1) A COMPARATIVE EXAMPLE

Conventional Organic Light Emitting Device

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1(1%) (50 Å)/Alq$_3$(350 Å)/LiF(5 Å)/Al(1000 Å)) were formed on ITO in $1.0 \times 10^{-6}$ torr.

When current of 0.9 mA was applied to the device, brightness was 1251 cd/m$^2$, a driving voltage was 6.5V, and a value of a color coordinate CIE was x=0.307 and y=0.612.

[Chemical formula 2-5]

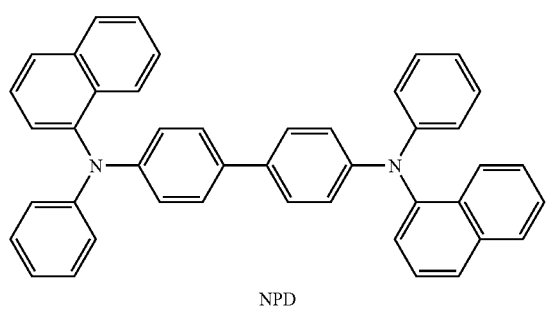

NPD

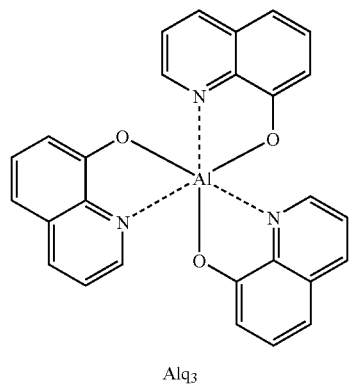

Alq$_3$

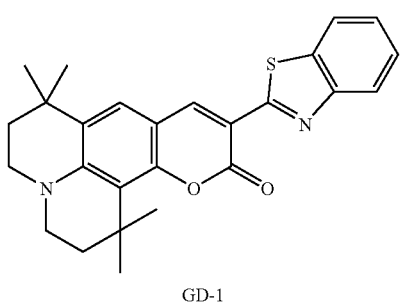

GD-1

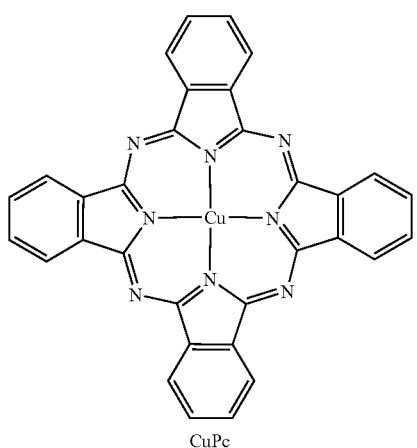

CuPc (2) EXAMPLE 1

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1 (1%) (50 Å)/TPA-1(350 Å)/LiF(5 Å)/Al(1000 Å)) were formed on ITO in $1.0 \times 10^{-6}$ torr. TPA-1 is an electron transport compound of 1-(4-(3'-pyridine)phenyl)-3,6,8-trhenylpyrene of chemical formula 2-6 in which A is pyridine and B and C are phenyl.

When current of 0.9 mA was applied to the device, brightness was 251 l/m$^2$, a driving voltage was 5.1V, and a value of a color coordinate CIE was x=0.301 and y=0.610.

[Chemical formula 2-6]

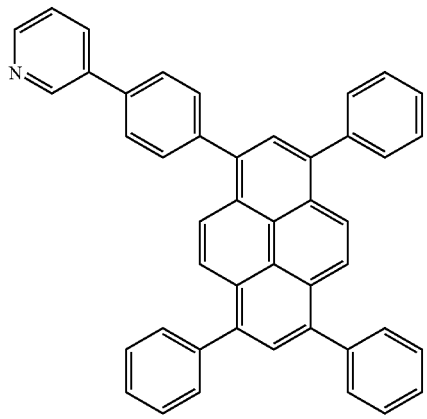

(3) EXAMPLE 2

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode CuPc(650 Å)/NPD(400 Å)/Alq$_3$(200 Å)+GD-1 (1%)(50 Å)/TPB-1(350 Å)/LiF(5 Å)/Al(1000 Å) were formed on ITO in $1.0 \times 10^{-6}$ torr. TPB-8 is a pyrene based electron transport compound of chemical formula 2-7 in which A is pyridine, B is biphenyl and C is phenyl.

When current of 0.9 mA was applied to the device, brightness was 2830 cd/m$^2$, a driving voltage was 5.1V, and a value of a color coordinate CIE was x=0.300 and y=0.607.

[Chemical formula 2-7]

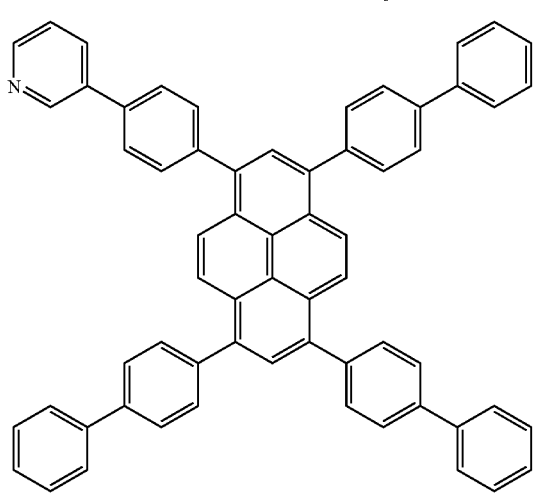

(4) EXAMPLE 3

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1(1%)(50 Å)/TPC-1(350 Å)/LiF(5 Å)/Al(1000 Å)) were formed on ITO in $1.0 \times 10^{-6}$ torr. TPC-1 is a pyrene based electron transport compound of chemical formula 2-8.

[Chemical formula 2-8]

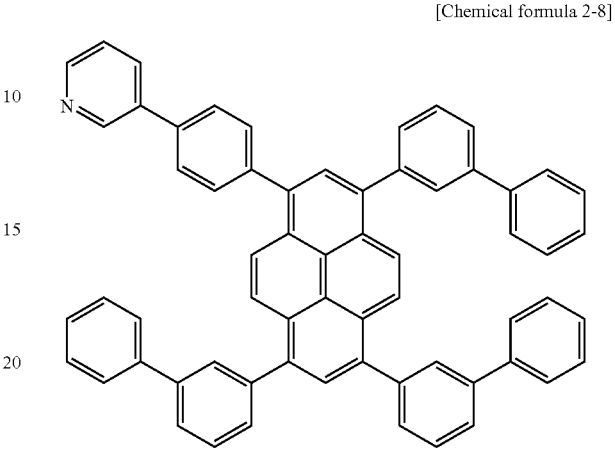

When current of 0.9 mA was applied to the device, brightness was 2770 cd/m$^2$, a driving voltage was 5.3V, and a value of a color coordinate CIE was x=0.302 and y=0.611.

(5) EXAMPLE 4

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1(1%)(50 Å)/TPE-1(350 Å)/LiF(5 Å)/Al(1000 Å)) were formed on ITO in $1.0 \times 10^{-6}$ torr TPE-1 is a pyrene based electron transport compound of chemical formula 2-9.

[Chemical formula 2-9]

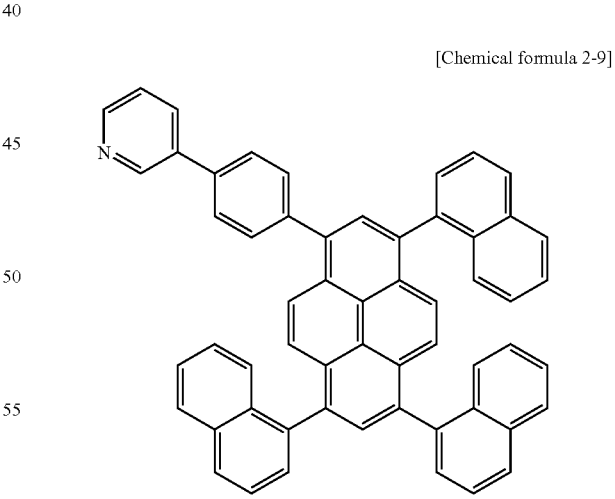

When current of 0.9 mA was applied to the device, brightness was 2069 cd/m$^2$, a driving voltage was 5.5V, and a value of a color coordinate CIE was x=0.304 and y=0.614.

(6) EXAMPLE 5

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1(1%) (50 Å)/TPF-1(350 Å)/LiF(5 Å)/Al(1000 Å)) were formed on ITO in 1.0×10$^{-6}$ torr. TPF-1 is a pyrene based electron transport compound of chemical formula 2-10.

[Chemical formula 2-10]

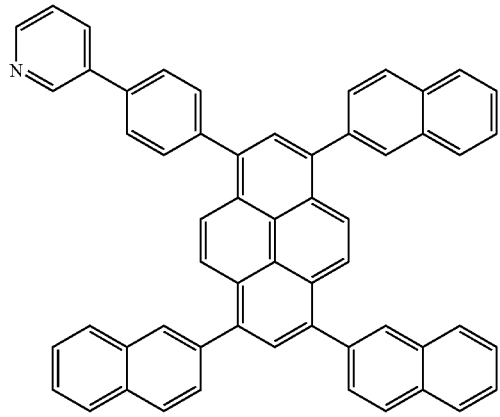

When current of 0.9 mA was applied to the device, brightness was 2466 cd/m$^2$, a driving voltage was 5.7V, and a value of a color coordinate CIE was x=0.300 and y=0.610.

(7) EXAMPLE 6

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1(1%) (50 Å)/TPK-1(350 Å)/LiF(5 Å)/Al(1000 Å)) were formed on ITO in 1.0×10$^{-6}$ torr. TPK-1 is a pyrene based electron transport compound of chemical formula 2-11.

[Chemical formula 2-11]

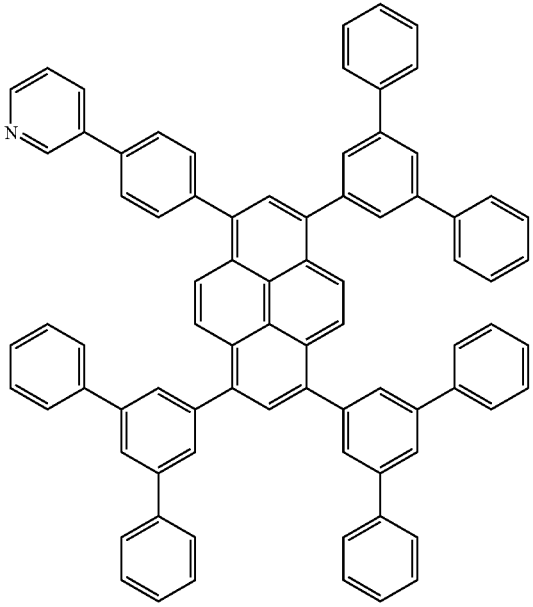

When current of 0.9 mA was applied to the device, brightness was 2750 cd/m$^2$, a driving voltage was 5.2V, and a value of a color coordinate CIE was x=0.302 and y=0.610.

As can be seen in a comparative experiment example, when organic light emitting device according to embodiments of this document use the pyrene based electron transport compound of chemical formula 2-1 described above in an electron injecting and transport layer, a value of a color coordinate CIE was x=0.300 to 0.307 and y=0.607 to 0.614, and thus it can be seen that an electron injecting and transport layer performs its own function.

As can be seen in Table 2, brightness of organic light emitting device according to embodiments of this document improves by minimum 77.2% (the sixth embodiment) and maximum 26% (the seventh embodiment), compared to brightness of conventional organic light emitting device. It can be seen that a driving voltage of organic light emitting device according to embodiments of this document was decreased to 5.1V to 5.7V.

TABLE 2

|  | brightness | driving voltage |
| --- | --- | --- |
| Comparative example | 1251 cd/m$^2$ | 6.5 V |
| Example 1 | 2511 cd/m$^2$ | 5.1 V |
| Example 2 | 2830 cd/m$^2$ | 5.1 V |
| Example 3 | 2770 cd/m$^2$ | 5.3 V |
| Example 4 | 2069 cd/m$^2$ | 5.5 V |
| Example 5 | 2466 cd/m$^2$ | 5.7 V |
| Example 6 | 2750 cd/m$^2$ | 5.2 V |

Embodiment 3

In order to achieve the object, this document provides a pyrene based electron transport compound having chemical formula 3-1.

[Chemical formula 3-1]

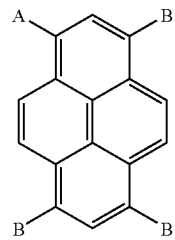

Pyrene based compound of chemical formula 3-1 is a very important compound among hydrocarbons. In the pyrene based compound, carbons are numbered clockwise starting with a carbon having a substituent A. Accordingly, an electron transport compound according to an embodiment of this document comprises a pyrene based compound in which A is bonded to carbon 1, and B is bonded to carbon 3, 6 and 8. The substituents A and B may be substituted or not substituted.

The electron transport compound is a compound that injects an electron from a cathode to other layer or transports an injected electron to other layers. For example, in organic light emitting device, an electron transport compound is a compound that may be a material of an electron injecting layer, an electron transport layer, or an electron injecting and transport layer in which the electron injecting layer and the electron transport layer are mixed.

In this document, an electron injecting and transport layer is used to generally designate layers, which are related to injecting and transporting of an electron, such as an electron injecting layer, an electron transport layer, or an electron injecting and transport layer in which the electron injecting layer and the electron transport layer are mixed.

A that is substituted or is not substituted may be selected from a group consisting of pyridinyl, quinolinyl, isoquinolinyl, quinoxalinyl, bipyridinyl, terpyridinyl, and phenanthrolinyl.

Further, B and C that are substituted or are not substituted may be selected from a group consisting of phenyl, biphenyl, naphthyl, fluorenyl, terphenyl, methyl, ethyl, propyl, i-propyl, halogen, phenanthrolinyl, phenanthryl, and anthryl.

When the A and B are substituted, a substituent of the A and B may be selected from a group consisting of aryl, alkyl, aryloxy, alkoxy, allylamino, alkylamino, halogen, and cyano.

Further, when the A and B are substituted, a substituent of the A and B may be selected from a group consisting of phenyl, biphenyl, triphenylmethyl, phenylethylidene, diphenylethylidene, phenylmethylidyne, phenoxy, tolyoxy, methyl, ethyl, propyl, i-propyl, t-butyl, cyclohexyl, diphenylamino, morpholine, methoxy, ethoxy, propoxy, butoxy, dimethylamino, diphenylamino, fluorine, and chlorine.

The A that is substituted or is not substituted is given by chemical formulas 3-2 and 3-3.

[Chemical Formula 3-2]

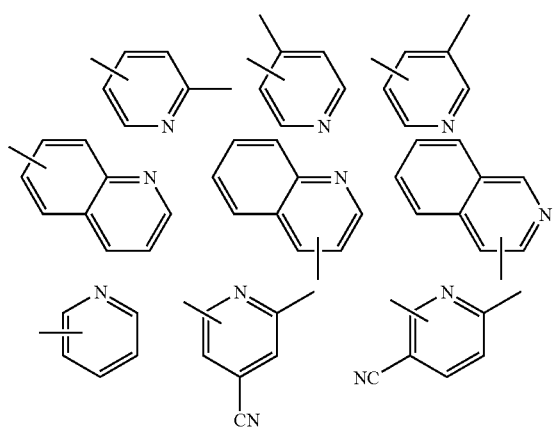

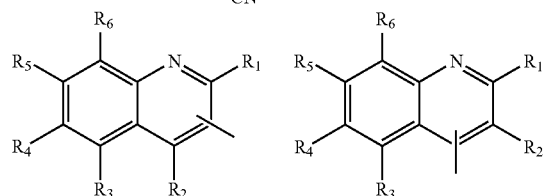

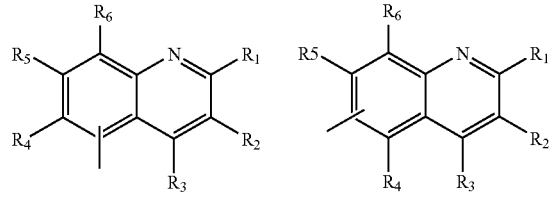

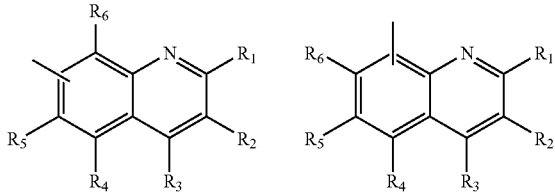

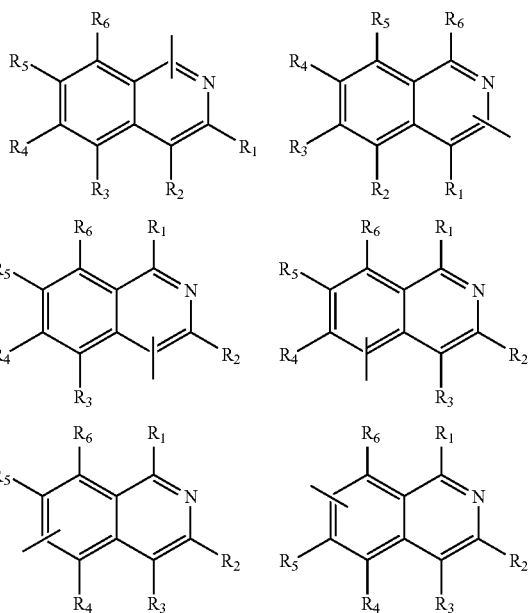

where any one of R1, R2, R3, R4, R5, and R6 is CH3, and the remaining ones are H.

[Chemical formula 3-3]

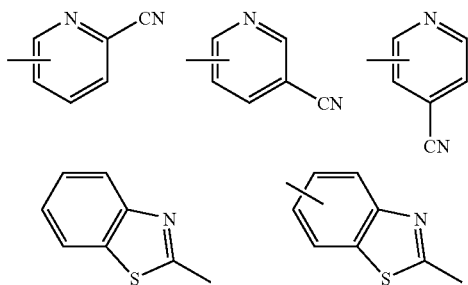

Similarly, the B that is substituted or not substituted is given by chemical formula 3-4.

[Chemical Formula 3-4]

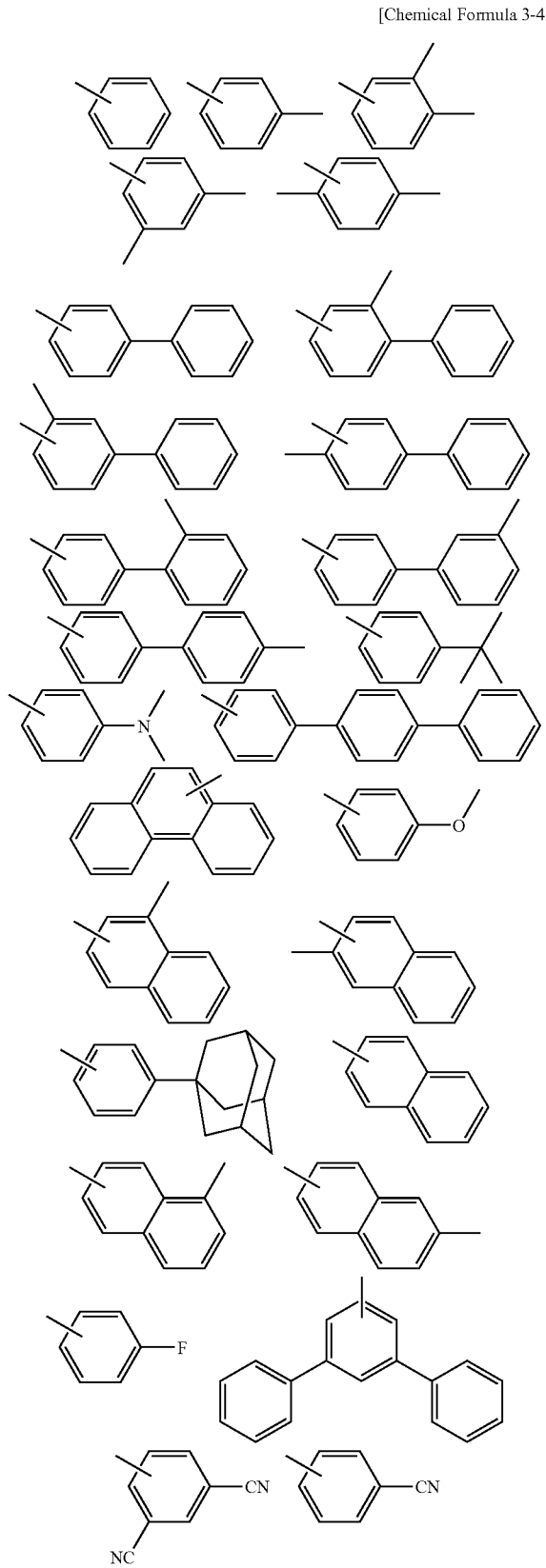

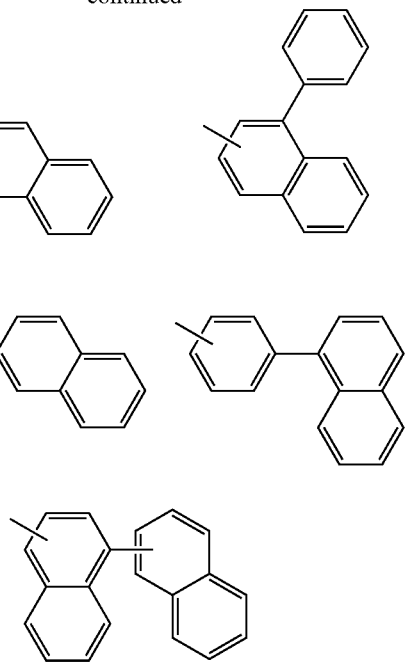

-continued

Various forms of electron transport compounds can be formed by combining the pyrene based electron transport compound of chemical formula 3-1 with substituents of chemical formulas 3-2 to 3-4. The electron transport compounds can be easily selected by those skilled in the art according to necessity of brightness, color purity, or a driving voltage.

This document provides organic light emitting device having the electron injecting and transport layer comprising the electron transport compound described above. The electron injecting and transport layer may be one or both of an electron injecting layer or an electron transport layer. The electron injecting and transport layer may be formed between an organic or inorganic light emitting layer and a cathode. The electron injecting and transport layer may have a different layer position when participating in injecting and transporting of an electron as described above.

Below, synthesis examples of some compounds of the pyrene based electron transport compounds of chemical formula 3-1 are described. Only synthesis examples of some compounds are described, but synthesis examples of other pyrene based electron transport compounds of chemical formula 3-1 are similar to these synthesis examples, the synthesis examples can be executed by those skilled in the art, and thus descriptions thereof will be omitted.

SYNTHESIS EXAMPLE 1-(3'-pyridine)-3,6,8-triphenyl-pyrene among electron transport compounds of an electron injecting and transport layer of organic light emitting device according to an embodiment of this document is synthesized as follows.

33
Synthesis of 1-(3'-pyridine)pyrene

[Reaction Equation 3-1]

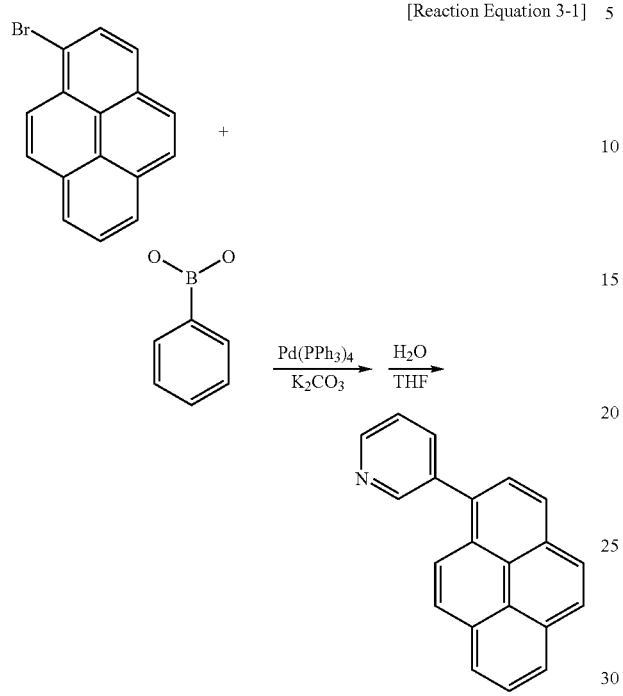

6.56 g (0.053 mol) of pyridinyl boronic acid and 5 g (0.0178 mol) of 1-bromopyrene were put in 100 mL of anhydrous THF and they were stirred in a dried three neck round bottom flask.

0.9 g of (tetrakis(triphenylphosphine)palladium)(0) and 15 g of potassium carbonate were melted in 100 mL of $H_2O$ added to the flask. Then they were stirred for 24 hours in a bath of 100□ and then when a reaction was ended, THF was removed from the reaction mixture.

Thereafter, the reaction mixture was extracted using dichloromethane and water and distilled under a reduced pressure, then the distilled mixture was purified by passing through a silica gel column. The purified mixture was distilled under a reduced pressure again. The purified and distilled mixture was recrystallized using dichloromethane and methanol and filtered. Then 1-(3'-pyridine)pyrene was obtained.

(2) Synthesis of 1-(3'-pyridine)-3,4,6-tribromopyrene

[Reaction Equation 3-2]

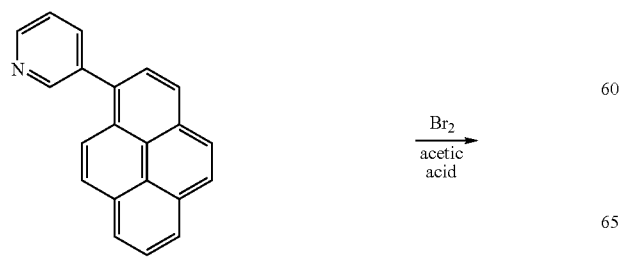

-continued

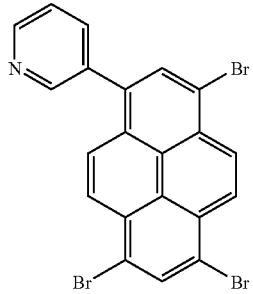

3 g (0.0107 mol) of 1-(3'-pyridine)pyrene was put in 80 mL of acetic acid and was stirred in a dried three neck round bottom flask. After 5.15 g (0.0322 mol) of bromine ($Br_2$) was added to the reaction mixture at a room temperature and when a reaction was ended, filtering was performed. By washing and then drying the reaction mixture with excessive distilled water, 1-(3'-pyridine)-3,6,8,-tribromopyrene was obtained.

(3) Synthesis of 1-(3'-pyridine)-3,6,8,-triphenyl-pyrene

[Reaction Equation 3-3]

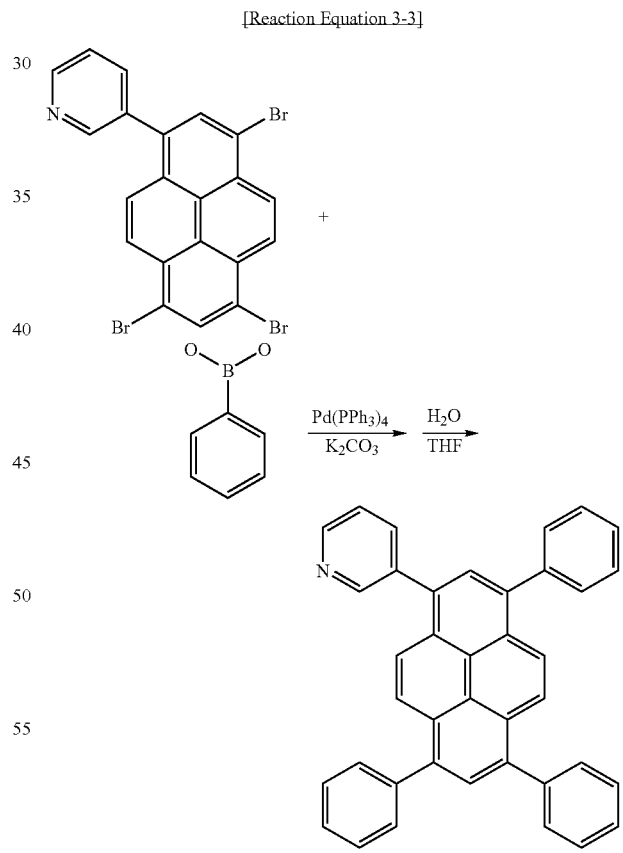

3 g (0.00581 mol) of 1-(3'-pyridine)-3,6,8,-tribromopyrene and 2.83 g (0.0232 mol) of phenyl boronic acid were put in 80 mL of anhydrous THF and they were stirred in a dried three neck round bottom flask.

0.5 g of (tetrakis(triphenylphosphine)palladium)(0) and 10 g of potassium carbonate were melted in 80 mL of $H_2O$ and $H_2O$ and added to the flask. Then they were stirred for 24 hours in a bath of 100□ and when a reaction was ended, THF was removed from the reaction mixture.

Thereafter, the reaction mixture was extracted using dichloromethane and water and distilled under a reduced pressure, then distilled mixture was purified by passing through a silica gel column. The purified mixture was distilled under a reduced pressure again. The purified and distilled mixture was recrystallized using dichloromethane and methanol and filtered. 1-(3'-pyridine)-3,6,8-triphenyl-pyrene, which is a final product was obtained.

[Brightness, Color Purity and Driving Voltage Test 3]

In order to confirm brightness characteristic and color purity of organic light emitting device according to an embodiment of this document, conventional organic light emitting device and organic light emitting device according to an embodiment of this document were manufactured and brightness, color purity, and a driving voltage thereof were measured under the same condition.

In other words, organic light emitting device according to an embodiment of this document was manufactured using the electron transport compound synthesized in the synthesis example and conventional organic light emitting device was manufactured using a conventional material in the electron injecting and transport layer. Then brightness, color purity, and a driving voltage thereof were measured under the same condition.

In examples, although some electron transport compounds according to embodiments of this document are described, an organic light emitting device manufactured using other pyrene based electron transport compound of chemical formula 1-1 may show the same or similar result as examples. The result may be expected by those skilled in the art and thus descriptions of other compounds will be omitted.

(1) A COMPARATIVE EXAMPLE

Conventional Organic Light Emitting Device

ITO glass was washed after being patterned so that a light emitting area thereof became 3 mm×3 mm. After the substrate was mounted in a vacuum chamber, a hole injecting layer/hole transport layer/green color organic emitting layer (host+dopant)/electron injecting and transport layer/cathode (CuPc (650 Å)/NPD(400 Å)/Alq$_3$(200 Å)+GD-1(1%) (50 Å)/Alq$_3$ (350 Å)/LiF(5 Å)/Al(1000 Å)) was formed on ITO in 1.0× $10^{-6}$ torr.

When current of 0.9 mA was applied to the device, brightness was 1251 cd/m$^2$, a driving voltage was 6.5V, and a value of a color coordinate CIE was x=0.307 and y=0.612.

[Chemical formula 3-5]

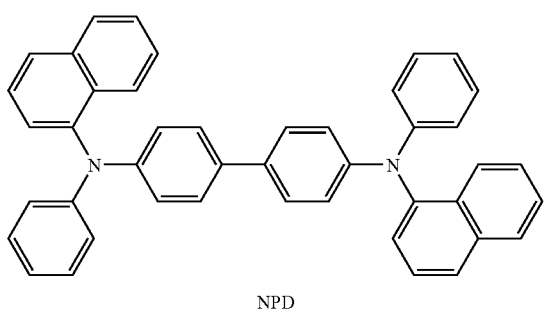

NPD

-continued

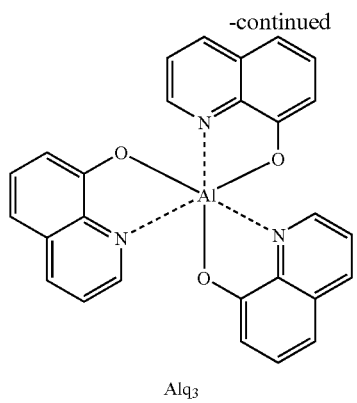

Alq$_3$

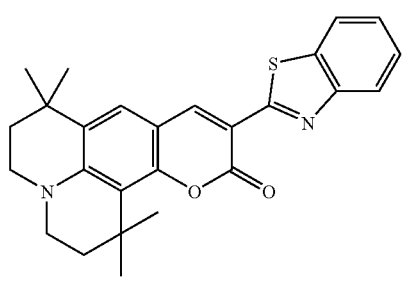

GD-1

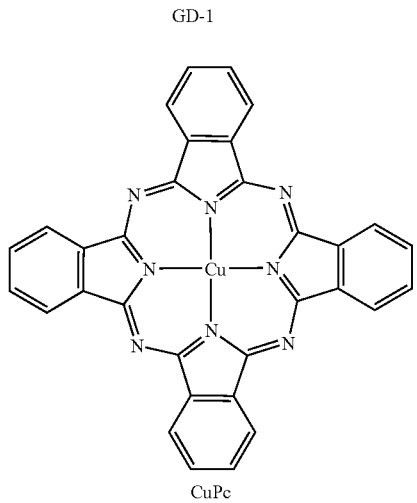

CuPc (2) EXAMPLE 1

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1 (1%) (50 Å)/TA-8(350 Å)/LiF(5 Å)/Al(1000 Å)) were formed on ITO in 1.0×10$^{-6}$ torr. TA-8 is an electron transport compound of 1-(3'-pyridine)-3,6,8-triphenyl-pyrene of chemical formula 3-6 in which A is pyridine and B and C are phenyl.

When current of 0.9 mA was applied to the device, brightness was 2403 cd/m$^2$, a driving voltage was 5.87V, and a value of a color coordinate CIE was x=0.301 and y=0.621.

[Chemical formula 3-6]

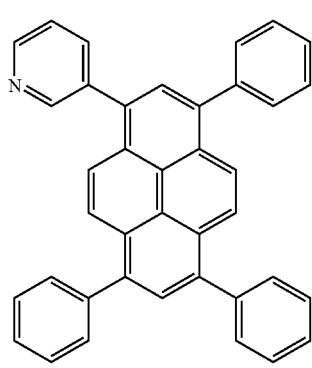

(3) EXAMPLE 2

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1 (1%)(50 Å)/TB-8(350 Å)/LiF(5 Å)/Al(1000 Å)) were formed on ITO in 1.0×10$^{-6}$ torr. TB-8 is a pyrene based electron transport compound of chemical formula 3-7 in which A is pyridine and B and C are phenyl.

When current of 0.9 mA was applied to the device, brightness was 2511 cd/m$^2$, a driving voltage was 5.7V, and a value of a color coordinate CIE was x=0.301 and y=0.607.

[Chemical formula 3-7]

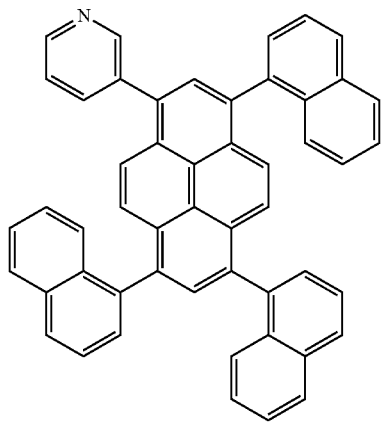

(4) EXAMPLE 3

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1 (1%) (50 Å)/TB-7(350 Å)/LiF(5 Å)/Al(1000 Å)) were formed on ITO in 1.0×10$^{-6}$ torr. TB-7 is a pyrene based electron transport compound of chemical formula 3-8 in which A is pyridine and B is phenyl.

[Chemical formula 3-8]

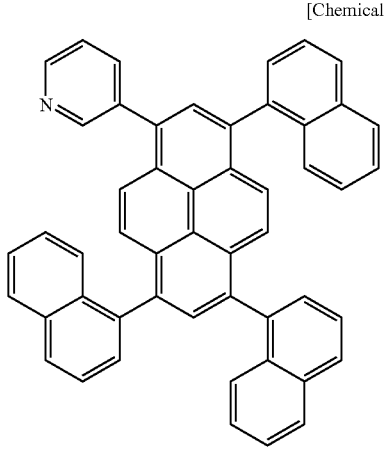

When current of 0.9 mA was applied to the device, brightness was 2398 cd/m$^2$, a driving voltage was 5.3V, and a value of a color coordinate CIE was x=0.304 and y=0.630.

(5) EXAMPLE 4

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1 (1%)(50 Å)/TC-8(350 Å)/LiF(5 Å)/Al(1000 Å)) were formed on ITO in 1.0×10$^{-6}$ torr. TC-8 is a pyrene based electron transport compound of chemical formula 3-9.

[Chemical formula 3-9]

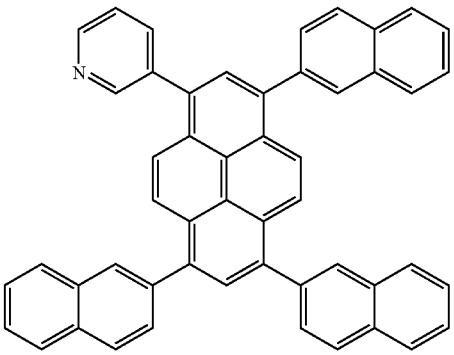

When current of 0.9 mA was applied to the device, brightness was 2382 cd/m$^2$, a driving voltage was 5.6V, and a value of a color coordinate CIE was x=0.299 and y=0.617.

(6) EXAMPLE 5

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq$_3$(200 Å)+GD-1 (1%) (50 Å)/TD-8(350 Å)/LiF(5 Å)/Al(1000 Å)) were formed on ITO in 1.0×10⁻⁶ torr. TD-8 is a pyrene based electron transport compound of chemical formula 3-10.

[Chemical formula 3-10]

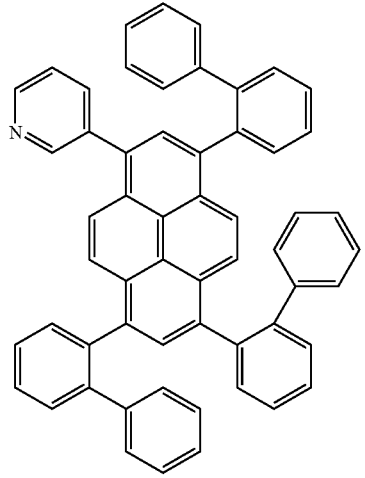

When current of 0.9 mA was applied to the device, brightness was 2698 cd/m², a driving voltage was 5.5V, and a value of a color coordinate CIE was x=0.300 and y=0.638.

(7) EXAMPLE 6

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq₃(200 Å)+GD-1 (1%)(50 Å)/TE-8(350 Å)/LiF(5 Å)/Al(1000 Å)) were formed on ITO in 1.0×10⁻⁶ torr. TE-8 is a pyrene based electron transport compound of chemical formula 3-11.

[Chemical formula 3-11]

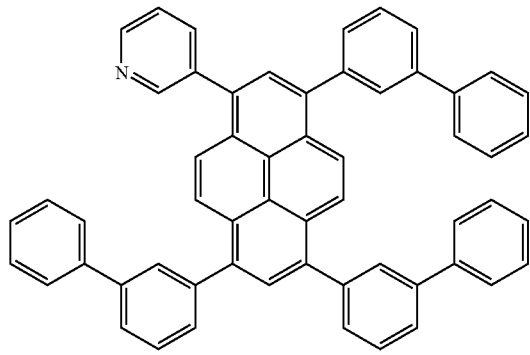

When current of 0.9 mA was applied to the device, brightness was 2732 cd/m², a driving voltage was 5.4V, and a value of a color coordinate CIE was x=0.300 and y=0.610.

(8) EXAMPLE 7

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq₃(200 Å)+GD-1 (1%)(50 Å)/TF-8(350 Å)/LiF(5 Å)/Al(1000 Å)) were formed on ITO in 1.0×10⁻⁶ torr. TF-8 is a pyrene based electron transport compound of chemical formula 3-12.

[Chemical formula 3-12]

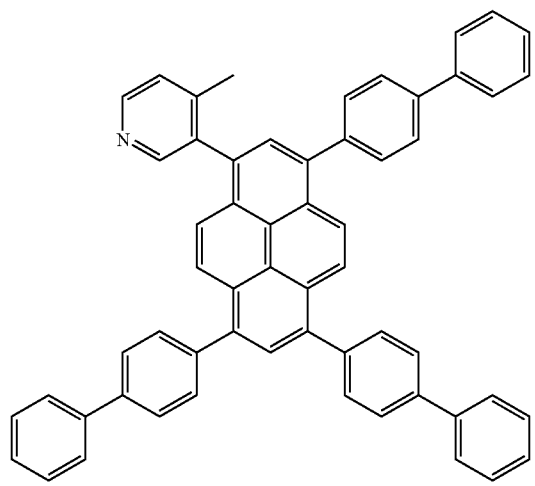

When current of 0.9 mA was applied to the device, brightness was 2287 cd/m², a driving voltage was 5.5V, and a value of a color coordinate CIE was x=0.300 and y=0.618.

(9) EXAMPLE 8

ITO glass was washed after being patterned so that a light emitting area thereof became 3 mm×3 mm. After the substrate was mounted in a vacuum chamber a hole injecting layer/a hole transport layer/a green organic emitting layer (host+dopant)/an electron injecting and transport layer/cathode (CuPc(650 Å)/NPD(400 Å)/Alq₃(200 Å)+GD-1 (1%) (50 Å)/TG-8(350 Å)/LiF(5 Å)/Al(1000 Å)) were formed on ITO in 1.0×10⁻⁶ torr. TG-8 is a pyrene based electron transport compound of chemical formula 3-13.

[Chemical formula 3-13]

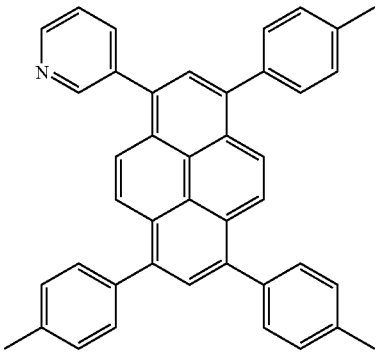

When current of 0.9 mA was applied to the device, brightness was 2096 cd/m², a driving voltage was 5.7V, and a value of a color coordinate CIE was x=0.304 and y=0.629.

(10) EXAMPLE 9

ITO glass was washed after being patterned so that a light emitting area thereof became 3 mm×3 mm. After the substrate was mounted in a vacuum chamber, a hole injecting layer/a hole transport layer/a green organic emitting layer (host+dopant)/an electron injecting and transport layer/cathode (CuPc(650 Å)/NPD(400 Å)/Alq₃(200 Å)+GD-1 (1%) (50 Å)/TJ-8(350 Å)/LiF(5 Å)/Al(1000 Å)) were formed on ITO in 1.0×10⁻⁶ torr. TJ-8 is a pyrene based electron transport compound of chemical formula 3-14.

[Chemical formula 3-14]

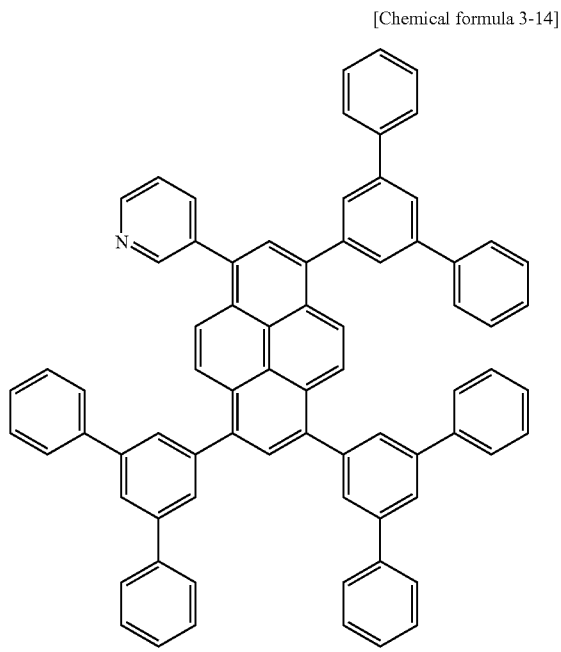

When current of 0.9 mA was applied to the device, brightness was 2937 cd/m², a driving voltage was 6.1V, and a value of a color coordinate CIE was x=0.307 and y=0.609.

As can be seen in the comparative example and examples, when organic light emitting devices according to embodiments of this document comprise the pyrene based electron transport compound of chemical formula 3-1 described above in an electron injecting and transport layer, a value of a color coordinate CIE was x=0.300 to 0.307 and y=0.600 to 0.630, and thus it can be seen that an electron injecting and transport layer performs its own function.

Referring to Table 3, brightness of organic light emitting device according to embodiments of this document improves by minimum 67.5% (the eighth embodiment) and maximum 135% (the ninth embodiment), compared to brightness of conventional organic light emitting device. It can be seen that a driving voltage of organic light emitting device according to embodiments of this document was decreased to 5.4V to 5.8V, compared to a driving voltage of conventional organic light emitting device.

TABLE 3

| | brightness | driving voltage |
|---|---|---|
| Comparative example | 1251 cd/m² | 6.5 V |
| Example 1 | 2403 cd/m² | 5.8 V |
| Example 2 | 2511 cd/m² | 5.7 V |
| Example 3 | 2398 cd/m² | 5.3 V |
| Example 4 | 2382 cd/m² | 5.6 V |
| Example 5 | 2698 cd/m² | 5.5 V |
| Example 6 | 2732 cd/m² | 5.4 V |
| Example 7 | 2287 cd/m² | 5.5 V |
| Example 8 | 2096 cd/m² | 5.7 V |
| Example 9 | 2937 cd/m² | 6.1 V |

As described above, this document can provide an electron transport compound that has high electron transport efficiency and good deposition characteristics, prevents crystallization, and has no influence on a lifetime of diodes.

As a result, organic light emitting device according to embodiments of this document can have improved brightness and a considerably low driving voltage while performing a function as an electron injecting and transport layer, compared to conventional organic light emitting device.

Embodiments are described, but this document is not limited thereto.

The invention being thus described, it will be obvious that the same may be varied in many ways. Such variations are not to be regarded as a departure from the spirit and scope of the invention, and all such modifications as would be obvious to one skilled in the art are intended to be comprised within the scope of the following claims.

What is claimed is:

1. An electron transport compound, having the following chemical formula,

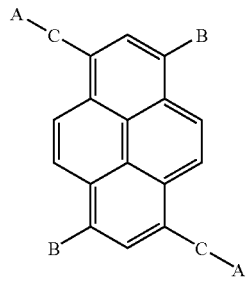

wherein A is selected from a group consisting of quinolinyl, isoquinolinyl, quinoxalinyl, bipyridinyl, terpyridinyl, and phenanthrolinyl, and B and C are selected from a group consisting of naphthyl, fluorenyl, terphenyl, phenanthrolinyl, phenanthryl, and anthryl.

2. An organic light emitting device having an electron injecting and transport layer comprising the electron transport compound of claim 1.

3. The organic light emitting device of claim 2, wherein the electron injecting and transport layer is one or both of an electron injecting layer or an electron transport layer.

4. The organic light emitting device of claim 3, wherein the organic light emitting device comprises an anode, an emitting layer comprising an organic material and a cathode, wherein the electron injecting and transport layer is formed between the emitting layer and a cathode.

5. An electron transport compound, having the following chemical formula,

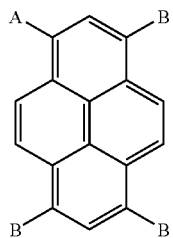

wherein A is selected from a group consisting of quinolinyl, isoquinolinyl, quinoxalinyl, bipyridinyl, terpyridinyl, and phenanthrolinyl, and B and C are selected from a group consisting of naphthyl, fluorenyl, terphenyl, phenanthrolinyl, phenanthryl, and anthryl.

6. An organic light emitting device having an electron injecting and transport layer comprising the electron transport compound of claim 5.

7. The organic light emitting device of claim 6, wherein the electron injecting and transport layer is one or both of an electron injecting layer or an electron transport layer.

8. The organic light emitting device of claim 7, wherein the organic light emitting device comprises an anode, an emitting layer comprising an organic material and a cathode, wherein the electron injecting and transport layer is formed between the emitting layer and a cathode.

* * * * *